US010763643B2

(12) United States Patent
Van Campenhout et al.

(10) Patent No.: US 10,763,643 B2
(45) Date of Patent: Sep. 1, 2020

(54) LASER DEVICES

(71) Applicants: IMEC VZW, Leuven (BE); Katholieke Universiteit Leuven, KU LEUVEN R&D, Leuven (BE); Universiteit Gent, Ghent (BE)

(72) Inventors: Joris Van Campenhout, Brussels (BE); Clement Merckling, Evere (BE); Maria Ioanna Pantouvaki, Kessel-Lo (BE); Ashwyn Srinivasan, Heverlee (BE); Irina Kulkova, Copenhagen (DK)

(73) Assignees: IMEC VZW, Leuven (BE); Katholieke Universiteit Leuven, KU LEUVEN R& D, Leuven (BE); Universiteit Gent, Ghent (BE)

( * ) Notice: Subject to any disclaimer, the term of this patent is extended or adjusted under 35 U.S.C. 154(b) by 0 days.

(21) Appl. No.: 15/840,779

(22) Filed: Dec. 13, 2017

(65) Prior Publication Data
US 2018/0183212 A1    Jun. 28, 2018

(30) Foreign Application Priority Data

Dec. 23, 2016   (EP) .................................... 16206840

(51) Int. Cl.
*H01S 5/323* (2006.01)
*H01S 5/026* (2006.01)
(Continued)

(52) U.S. Cl.
CPC .............. *H01S 5/323* (2013.01); *H01S 5/021* (2013.01); *H01S 5/026* (2013.01); *H01S 5/0218* (2013.01);
(Continued)

(58) Field of Classification Search
CPC ......... H01S 5/204–2045; H01S 5/4012; H01S 5/4025; H01S 5/4031; H01S 5/42–423;
(Continued)

(56) References Cited

U.S. PATENT DOCUMENTS 5,452,318 A * 9/1995 Makino ................. H01S 5/1228
                                                372/45.01
5,539,214 A * 7/1996 Lynch .................... B82Y 10/00
                                                257/14

(Continued)

FOREIGN PATENT DOCUMENTS

EP    2 866 317 A1    4/2015
GB    1539028 A  *   1/1979  ............. H01S 5/026

OTHER PUBLICATIONS

European Search Report, European Patent Application No. 16206840.7, dated Jun. 27, 2017, 8 pages.
(Continued)

*Primary Examiner* — Joshua King
(74) *Attorney, Agent, or Firm* — McDonnell Boehnen Hulbert & Berghoff LLP

(57) ABSTRACT

An electrically-operated semiconductor laser device and method for forming the laser device are provided. The laser device includes a fin structure to which a waveguide is optically coupled. The waveguide is optically coupled to passive waveguides at either end thereof. The fin structure includes an array of fin elements, each fin element comprising Group III-V materials.

8 Claims, 20 Drawing Sheets

(51) Int. Cl.
*H01S 5/042* (2006.01)
*H01S 5/10* (2006.01)
*H01S 5/343* (2006.01)
*H01S 5/12* (2006.01)
*H01S 5/02* (2006.01)
*H01S 5/30* (2006.01)

(52) U.S. Cl.
CPC .......... *H01S 5/0421* (2013.01); *H01S 5/1032* (2013.01); *H01S 5/1057* (2013.01); *H01S 5/1228* (2013.01); *H01S 5/3054* (2013.01); *H01S 5/34306* (2013.01); *H01S 5/0203* (2013.01); *H01S 5/1039* (2013.01)

(58) Field of Classification Search
CPC .................. H01S 5/4068; H01S 5/026; H01S 5/1028–1035; H01S 5/1039; H01S 5/1057; H01S 5/1064; H01S 5/3013; H01S 5/323–32391; H01S 5/343–34393; H01S 5/021; H01S 5/0218; G02B 2006/12121
See application file for complete search history.

(56) References Cited

U.S. PATENT DOCUMENTS

| | | | |
|---|---|---|---|
| 6,201,824 B1 | 3/2001 | Hong et al. | |
| 2002/0057491 A1* | 5/2002 | Dorgeuille | H01S 5/50 359/344 |
| 2005/0094925 A1* | 5/2005 | Kish, Jr. | B82Y 20/00 385/14 |
| 2007/0153868 A1* | 7/2007 | West | G02B 6/12004 372/92 |
| 2007/0220713 A1 | 9/2007 | Choy et al. | |
| 2008/0128713 A1* | 6/2008 | Saito | H01L 33/34 257/86 |
| 2008/0197362 A1* | 8/2008 | Hisamoto | G02B 6/13 257/86 |
| 2010/0051900 A1* | 3/2010 | Huffaker | B82Y 20/00 257/13 |
| 2011/0227116 A1* | 9/2011 | Saito | H01L 31/103 257/98 |
| 2013/0252361 A1* | 9/2013 | Li | H01L 21/02639 438/42 |
| 2013/0259077 A1* | 10/2013 | Ben Bakir | G02B 6/12004 372/44.01 |
| 2014/0175378 A1* | 6/2014 | Goel | H01L 21/764 257/15 |
| 2014/0175490 A1* | 6/2014 | Suwa | H01L 33/0054 257/98 |
| 2015/0030047 A1* | 1/2015 | Cheng | H01S 3/2375 372/50.1 |
| 2015/0030282 A1* | 1/2015 | Park | G02B 6/12004 385/14 |
| 2015/0055669 A1* | 2/2015 | Tani | H01L 33/34 372/45.01 |
| 2015/0333481 A1* | 11/2015 | Van Thourhout | H01S 5/021 372/45.01 |
| 2016/0087160 A1* | 3/2016 | Cheng | H01S 5/026 257/13 |
| 2016/0094014 A1* | 3/2016 | Shin | H01S 5/2031 372/45.01 |
| 2016/0252692 A1* | 9/2016 | Hofrichter | H01S 5/0014 250/227.11 |
| 2016/0293801 A1* | 10/2016 | Leobandung | H01L 25/041 |
| 2016/0327759 A1* | 11/2016 | Keyvaninia | G02B 6/14 |

OTHER PUBLICATIONS

Frost, Thomas et al., "Monolithic Electrically Injected Nanowire Array Edge-Emitting Laser on (001) Silicon", Nano Letters, vol. 14, 2014, pp. 4535-4541.

Frost, Thomas et al., "A Monolithic Electrically Injected Nanowire Laser on (001) Silicon", Supporting Information, Nano Letters, vol. 14, 2014, 7 pages.

Hartmann, Jana et al., "High Aspect Ratio GaN Fin Microstructures With Nonpolar Sidewalls by Continuous Mode Metalorganic Vapor Phase Epitaxy", Crystal Growth & Design, vol. 16, Feb. 3, 2016, pp. 1458-1462.

Kouno, Tetsuya et al., "Two-Dimensional Light Confinement in Periodic InGaN/GaN Nanocolumn Arrays and Optically Pumped Blue Stimulated Emission", Optics Express, vol. 17, No. 22, Oct. 26, 2009, pp. 20440-20447.

Rishinaramangalam, Ashwin K. et al., "Selective-Area Growth of III-Nitride Core-Shell Nanowalls for Light-Emitting and Laser Diodes", Optical Society of America, 2014, 2 pages.

Kim, Seung Hyun et al., "Inverse Metal-Assisted Chemical Etching Produces Smooth High Aspect Ratio InP Nanostructures", Nano Letters, vol. 15, 2015, pp. 641-648.

Silvestre, E. et al., "Analysis and Design of an Endlessly Single-Mode Finned Dielectric Waveguide", J. Opt. Soc. Am., vol. 15, No. 12, Dec. 1998, pp. 3067-3075.

* cited by examiner

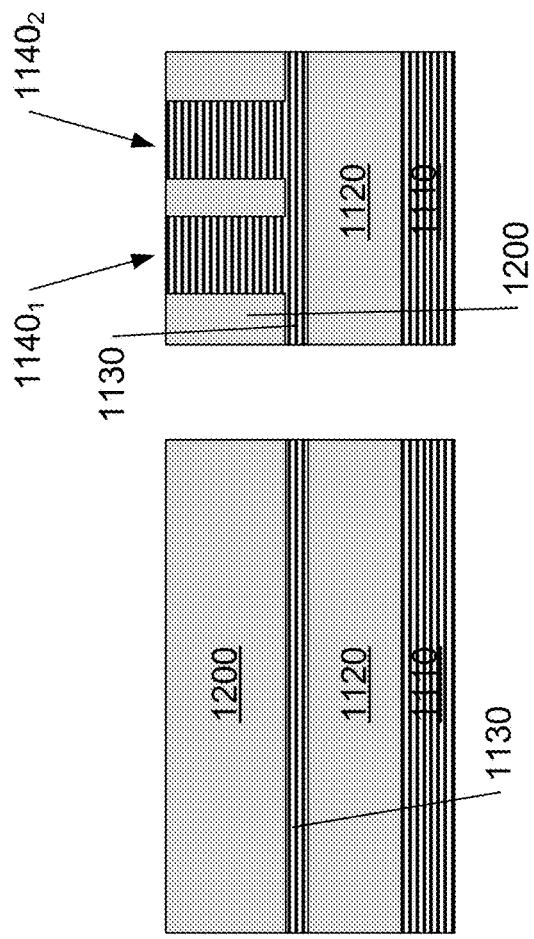
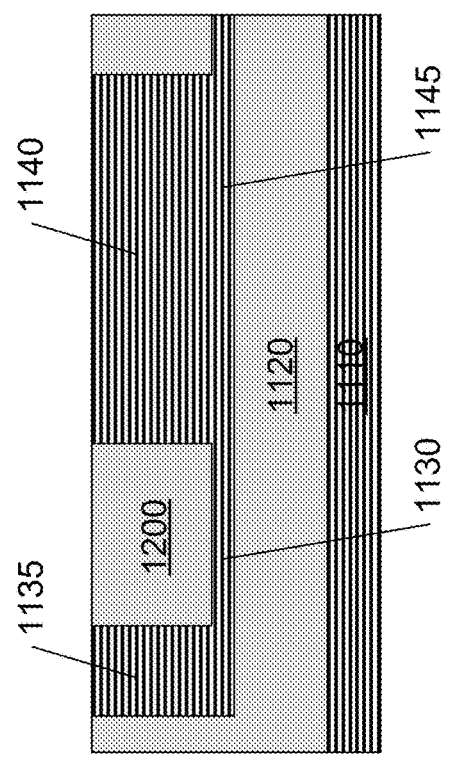
Fig. 17c
Fig. 17b
Fig. 17a

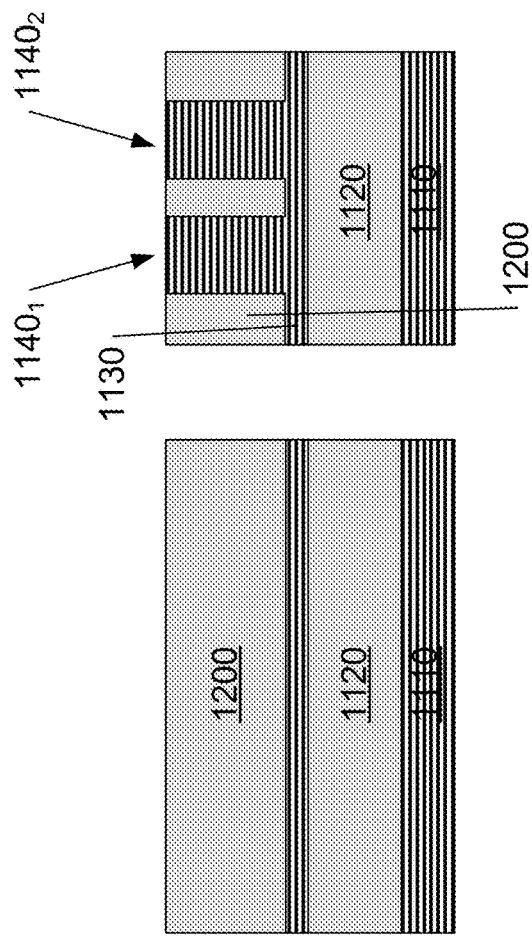
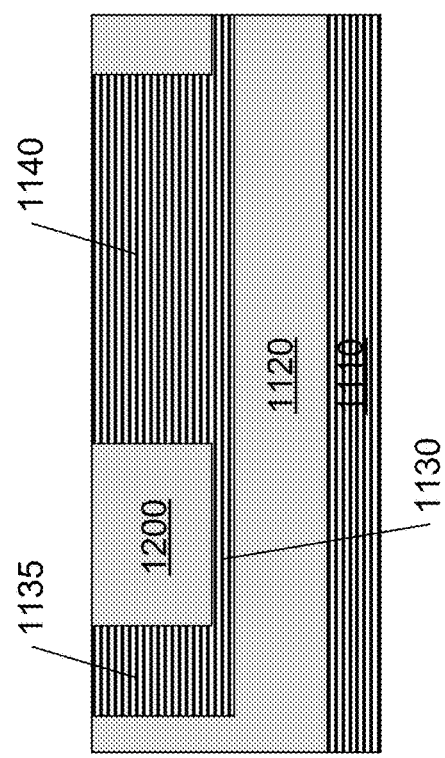
Fig. 18c
Fig. 18b
Fig. 18a

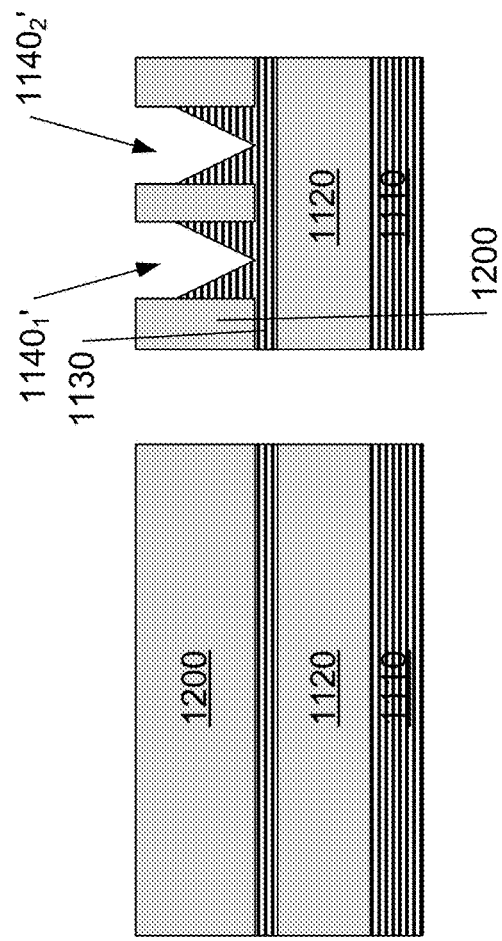
Fig. 19c
Fig. 19b
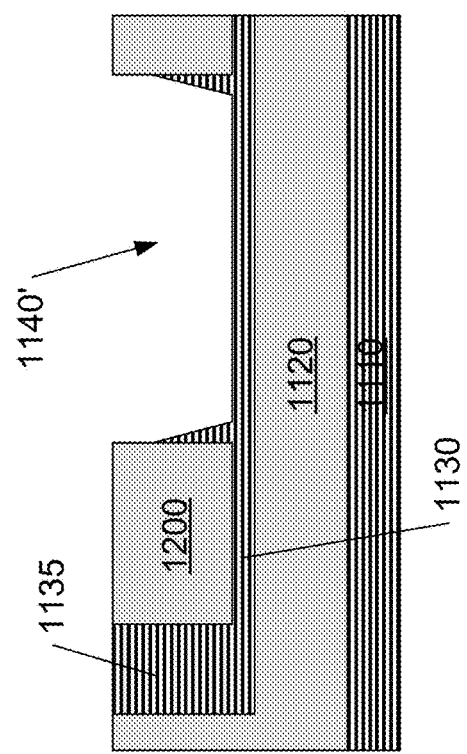
Fig. 19a

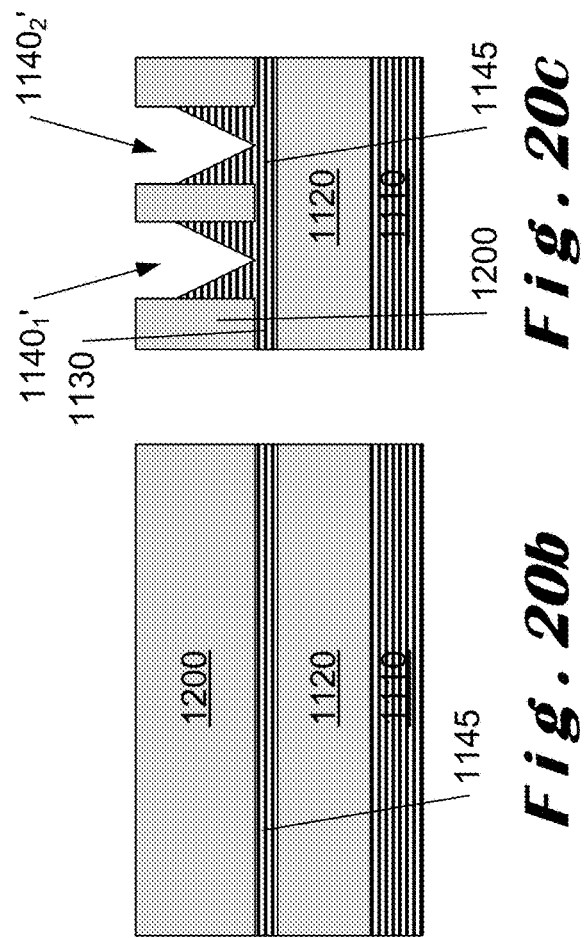
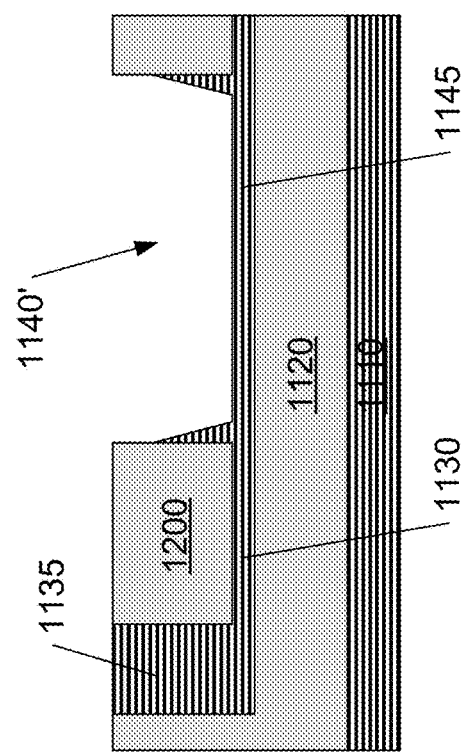
Fig. 20a  Fig. 20b  Fig. 20c

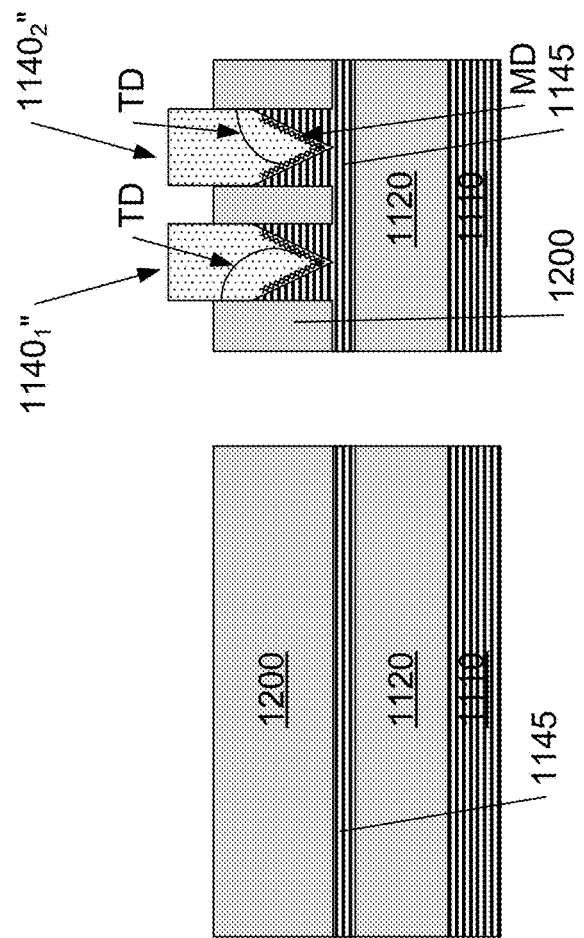
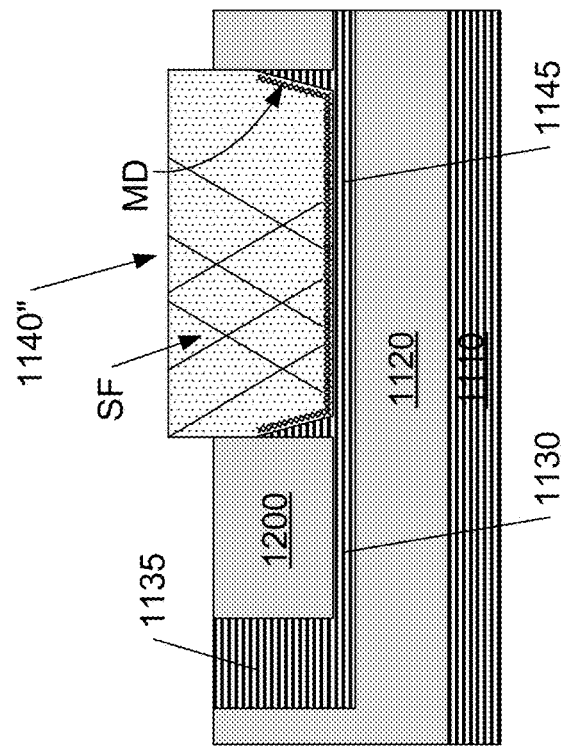
Fig. 21c
Fig. 21b
Fig. 21a

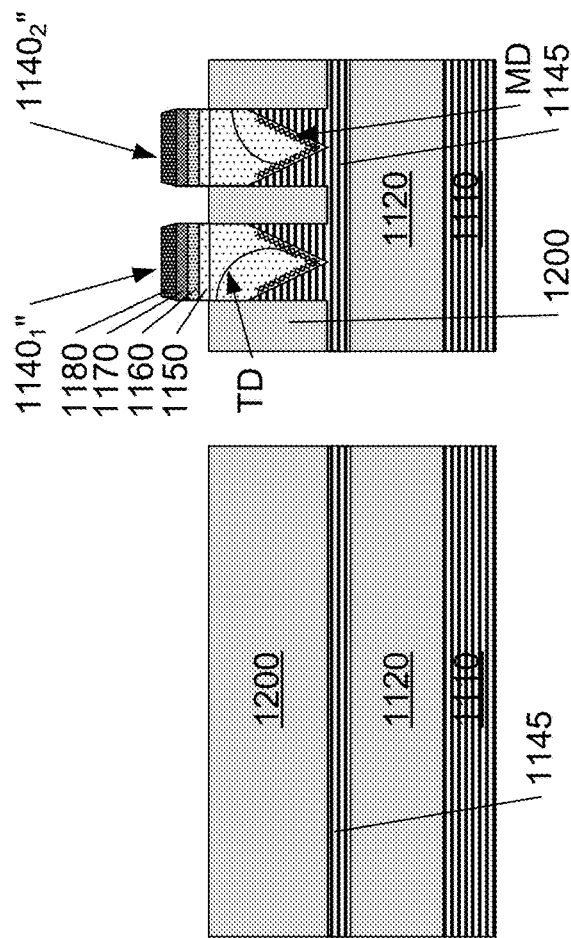
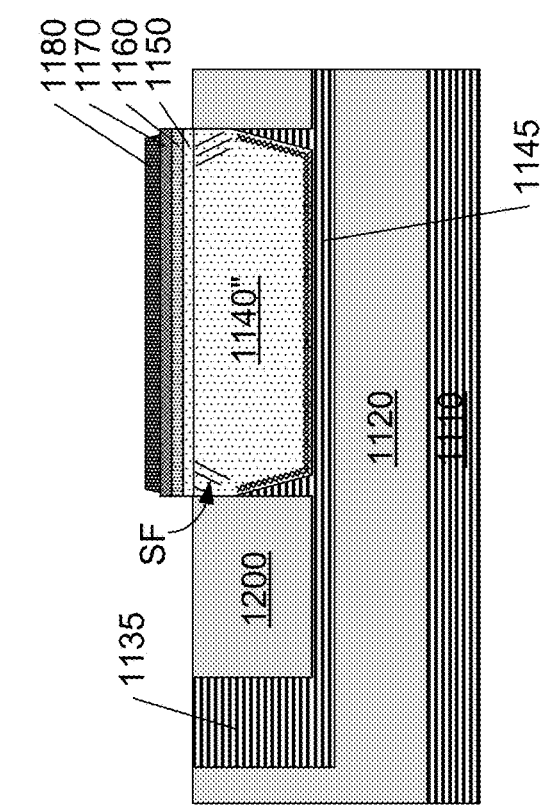
Fig. 23a  Fig. 23b  Fig. 23c

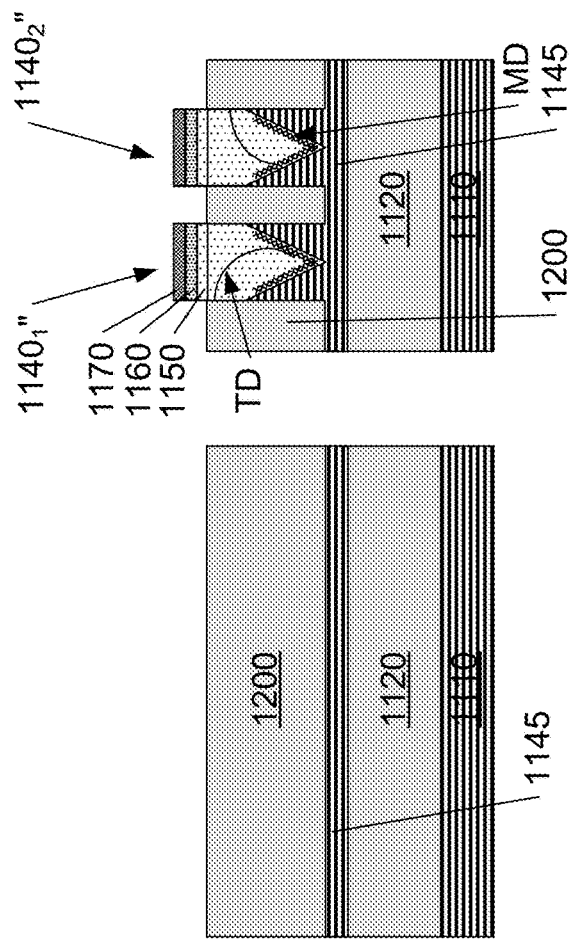
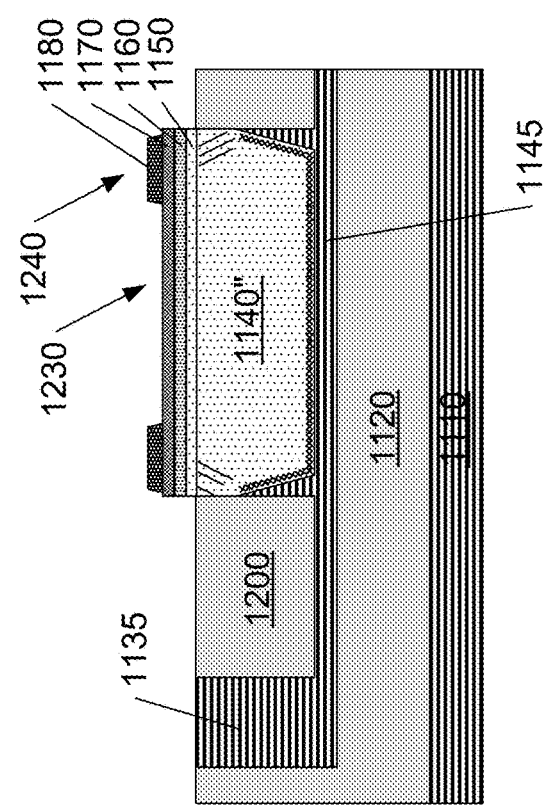
Fig. 24a
Fig. 24b
Fig. 24c

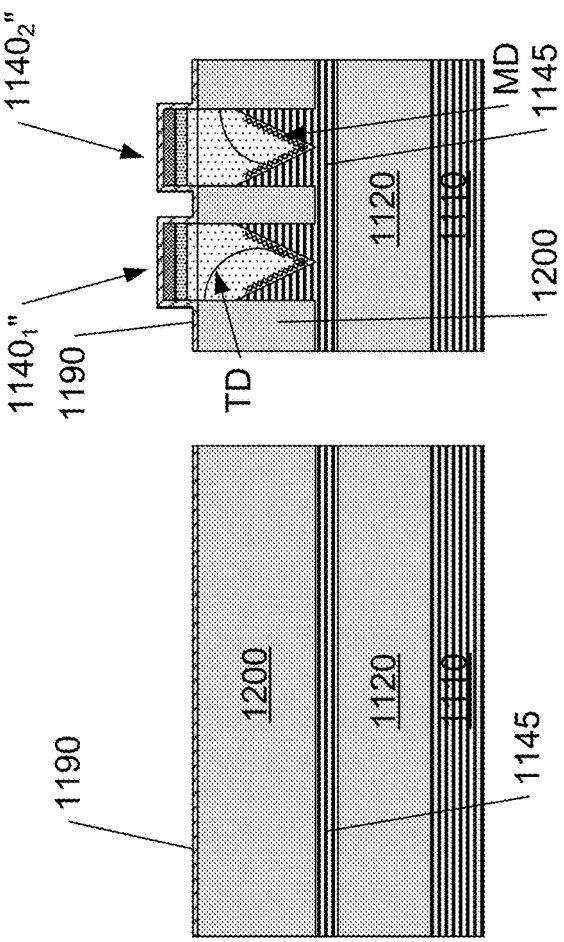
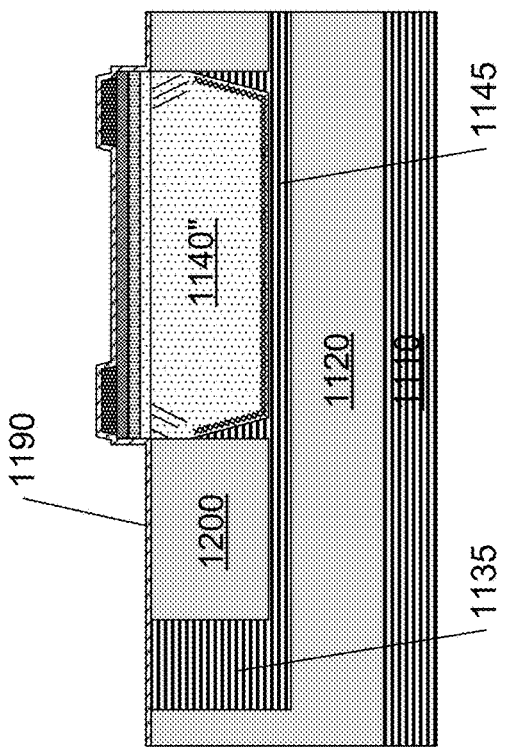
Fig. 25c
Fig. 25b
Fig. 25a

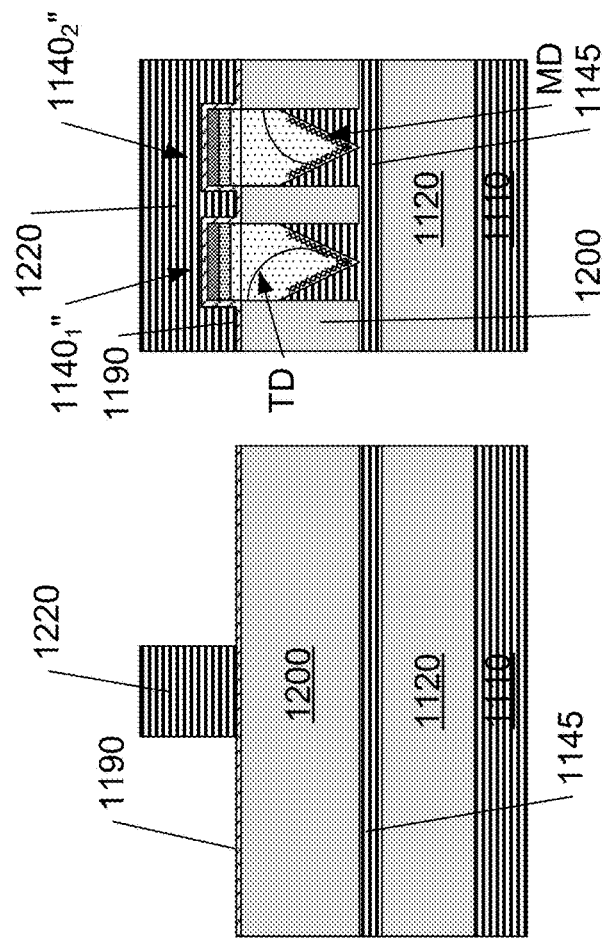
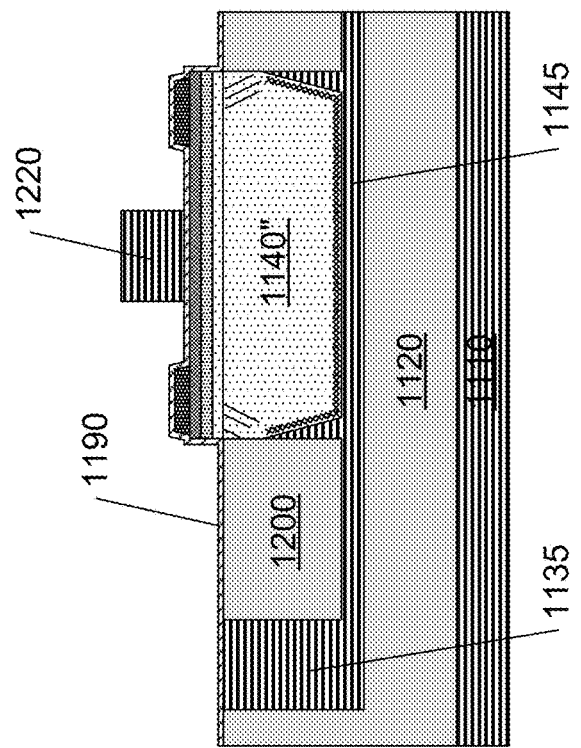
Fig. 26c
Fig. 26b
Fig. 26a

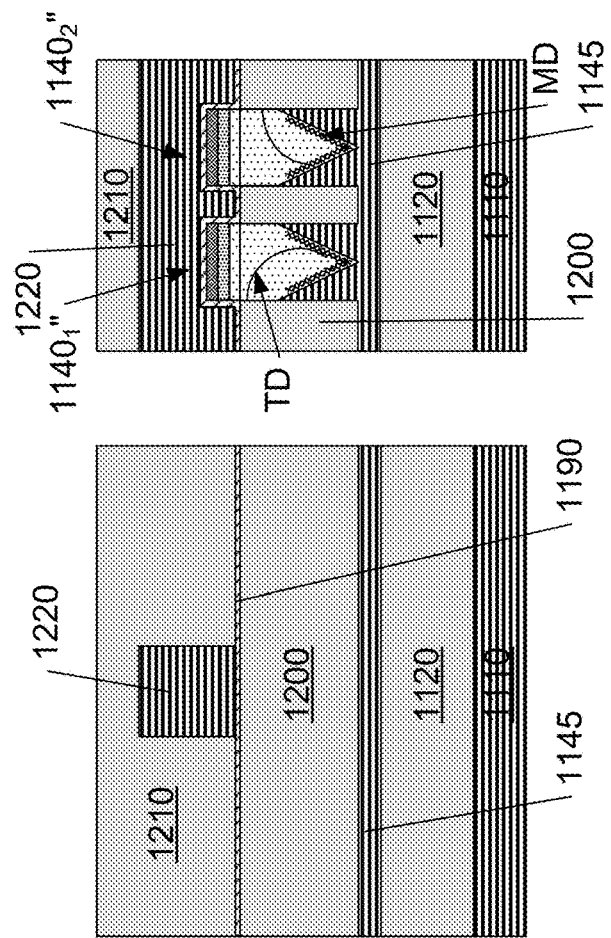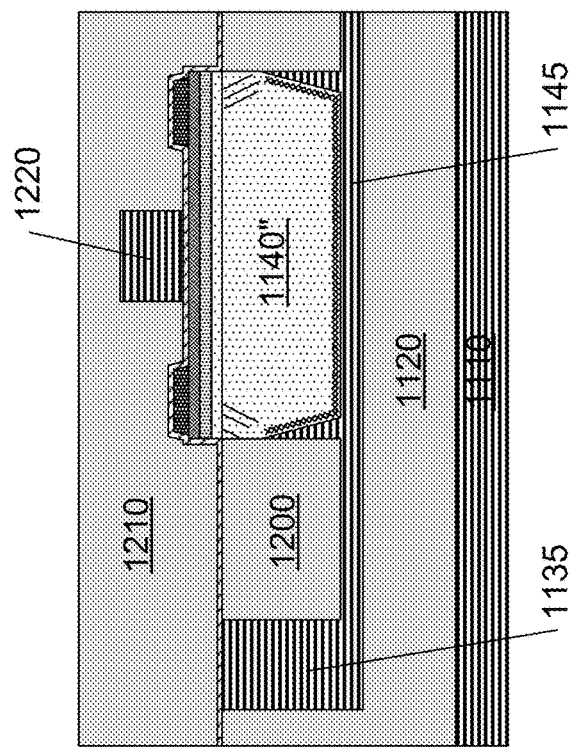

LASER DEVICES

CROSS-REFERENCE TO RELATED APPLICATIONS

The present application is a non-provisional patent application claiming priority to European Patent Application No. 16206840.7, filed Dec. 23, 2016, the contents of which are hereby incorporated by reference.

FIELD OF THE DISCLOSURE

The present disclosure relates to improvements in or relating to laser devices, and, is more particularly, although not exclusively, concerned with semiconductor waveguide laser devices.

BACKGROUND

Group III-V structures are useful for generating light in conventional light-emitting diode (LED) elements. Group III-V materials have also been proposed for use as three-dimensional structures such as an edge-emitting GaN disk-in-nanowire array electrically pumped laser as described in the article "Monolithic Electrically Injected Nanowire Array Edge-Emitting Laser on (001) Silicon" by Thomas Frost et al., Nano Lett. 2014, pages 4535 to 4541. In this structure, the nanowires are contacted at the top and bottom.

A silicon or germanium (Group IV material) integrated laser is described in US-A-2014/0175490 in which fins are combined with a waveguide. An array of vertical fins are provided in a laser cavity with a waveguide being formed on top of the fins for optical guiding and collection. Contacts are made on the sides of the fins.

However, when considering Group III-V materials, an epitaxial layer is prone to defects due to direct epitaxial growth of indium-phosphide/indium-gallium-arsenide (InP/InGaAs) on silicon. These defects include misfit dislocations (MDs), threading dislocations (TDs), stacking faults (SFs), and, point defects (PDs). Whilst MDs tend to be present at the interface with the substrate on which the epitaxial layer is grown, TDs extend as linear defects and SFs extend as planar defect from these points into the epitaxial layer, while PDs may be present throughout the body of the epitaxial layer. The presence of such defects makes it difficult to grow Group III-V materials which are suitable for laser applications.

It is also difficult to provide an optical cavity which has low parasitic losses with strong overlap of optical mode with an active gain medium, such as, an InGaAs active layer. Low loss feedback mechanisms are also required. Moreover, there are challenges with providing good carrier inversion in the optical gain layer, namely, free electron/hole injection when embedded in a forward biased p-i-n junction. Low series resistance is required for ohmic contacts to the p- and n-sides of the p-i-n junction which requires doping levels to be adjusted to avoid high optical loss. In addition, low parasitic losses in the laser cavity or waveguide need to be preserved so that there is a requirement for low optical overlap of contact layers with the optical mode of the fin structure.

Furthermore, efficient, low-loss coupling interfaces are needed between the laser cavity waveguide and passive (output) waveguides.

SUMMARY

It is therefore an object of the present disclosure to provide an electrically-operated fin-based Group III-V materials laser device which is substantially free from the defects mentioned above.

It is another object of the present disclosure to provide a method of manufacturing such an electrically-operated Group III-V materials laser device.

In accordance with one aspect of the present disclosure, there is provided a laser device comprising:

at least one fin element configured to generate light when electrically stimulated; and an overlay waveguide configured to be optically coupled to the at least one fin element;

wherein the at least one fin element comprises Group III-V materials.

By having at least one fin element, it is possible to decouple electrical contacts from optical contacts in the optical waveguide. Moreover, fin elements can readily be exploited to provide an optical active material which can readily be linked to a waveguide, the fin elements extending in a direction perpendicular to a longitudinal axis of the waveguide. In addition, it is possible to reduce defects created during epitaxial growth of Group III-V materials owing to the aspect ratio of the grown III-V fin structures, and therefore obtain a laser device with improved light generation properties.

In one embodiment, the at least one fin element comprises a body portion comprising indium-phosphide, InP, or other Group III-V materials such as GaAs or InGaAs, formed on a silicon substrate, the body portion forming an optically active region.

In one embodiment, the body portion comprises an annealed epitaxially grown Group III-V material in which planar stacking fault defects are located towards edges of the fin and threading dislocation defects are minimized by aspect ratio trapping to improve optical characteristics of the optically active region.

The body portion comprises semi-isolating regions arranged on either side of a central region.

In another embodiment, the at least one fin element may comprise an etched body portion.

In an embodiment, the at least one fin element comprises a contact portion comprising a layer of indium-gallium-arsenide, In(Ga)As, p+ type material arranged over the body portion. The contact portion may comprise an active layer formed over the body portion, the active layer being located between the contact layer and the body portion and spaced therefrom by respective layers of p+ doped and n+ doped indium-phosphide, InP.

In another embodiment, the overlay waveguide comprises amorphous silicon or poly-crystalline Si.

In one embodiment, the laser device comprises a plurality of fin elements of Group III-V materials, and, each fin contributes to the light transferred to the overlay waveguide when electrically stimulated. In effect, the laser device of the present disclosure comprises a combination of an array of optically active fin elements comprising Group III-V materials with a perpendicularly oriented passive optical overlay waveguide to create a heterogeneous periodic III-V/silicon waveguide.

In accordance with another aspect of the present disclosure, there is provided a method of forming a laser device comprising at least one fin element optically coupled to a waveguide, the method comprising the steps of:

a) forming a fin element in silicon on a silicon substrate;
b) etching away part of the fin element to define a recess;

c) growing epitaxially an optically active material within the recess to define a body portion of the fin element;

d) forming at least one contact layer over the optically active material in the recess; and e) forming the waveguide over the at least one contact layer of the fin element;

wherein step d) comprises using a Group III-V material as the optically active material.

The disadvantages associated with the use of Group III-V materials are substantially overcome as it is possible to relocate the defects discussed above to fall outside the optically active area of the fin element.

In one embodiment, this is achieved where step c) further comprises annealing the epitaxially grown optically active material to move stacking fault defects to edges of the fin and to minimize threading dislocation defects in an active region of the at least one fin element by aspect-ratio trapping. In effect, threading dislocation (TD) defects can be trapped inside the lower part of the III-V fins due to the particular TD orientation within the at least one fin element and the appropriately chosen aspect ratio of the fin element as described below.

Contacts and metal interconnects are formed with the at least one contact layer to provide appropriate electrical connections to the at least one fin element to be able to drive the device for optical efficiency.

Step d) may further comprise the step of forming a passivation layer over the at least one contact layer.

In one embodiment, step b) further may further comprise appropriately doping regions within the silicon structure to define highly doped silicon contact regions.

Step a) may further comprise implanting highly doped silicon material within the silicon substrate to define contact regions.

In one embodiment, step d) further comprises forming a p-i-n stack as the at least one contact layer. The at least one contact layer may comprise Group III-V materials.

BRIEF DESCRIPTION OF THE FIGURES

For a better understanding of the present disclosure, reference will now be made, by way of example, to the accompanying drawings.

FIGS. 17a, 17b and 17c respectively illustrate a transverse cross-section through a fin, a transverse cross-section through shallow trench isolation oxide, and a longitudinal cross-section through the centre of a representative embodiment of a semiconductor waveguide laser device in accordance with the present disclosure, and, illustrating fin patterning.

FIGS. 18a, 18b and 18c are similar to respective ones of FIGS. 17a, 17b and 17c, and, illustrate representative silicon implantation or doping.

FIGS. 19a, 19b and 19c are similar to respective ones of FIGS. 18a, 18b and 18c, and, illustrate a representative selective silicon wet recess process.

FIGS. 20a, 20b and 20c are similar to respective ones of FIGS. 19a, 19b and 19c, and, illustrate a representative selective silicon wet etch process.

FIGS. 21a, 21b and 21c are similar to respective ones of FIGS. 20a, 20b and 20c, and, illustrate a representative selective indium-phosphide buffer growth.

FIGS. 23a, 23b and 23c are similar to respective ones of FIGS. 22a, 22b and 22c, and, illustrate Group III-V stack growth.

FIGS. 24a, 24b and 24c are similar to respective ones of FIGS. 23a, 23b and 23c, and, illustrate representative contact layer selective etch.

FIGS. 25a, 25b and 25c are similar to respective ones of FIGS. 24a, 24b and 24c, and, illustrate the formation of a passivation layer.

FIGS. 26a, 26b and 26c are similar to respective ones of FIGS. 25a, 25b and 25c, and illustrate the formation of an overlay waveguide.

FIGS. 27a, 27b and 27c are similar to respective ones of FIGS. 26a, 26b and 26c, and illustrate the formation of a pre-metal dielectric layer.

Figure 1:
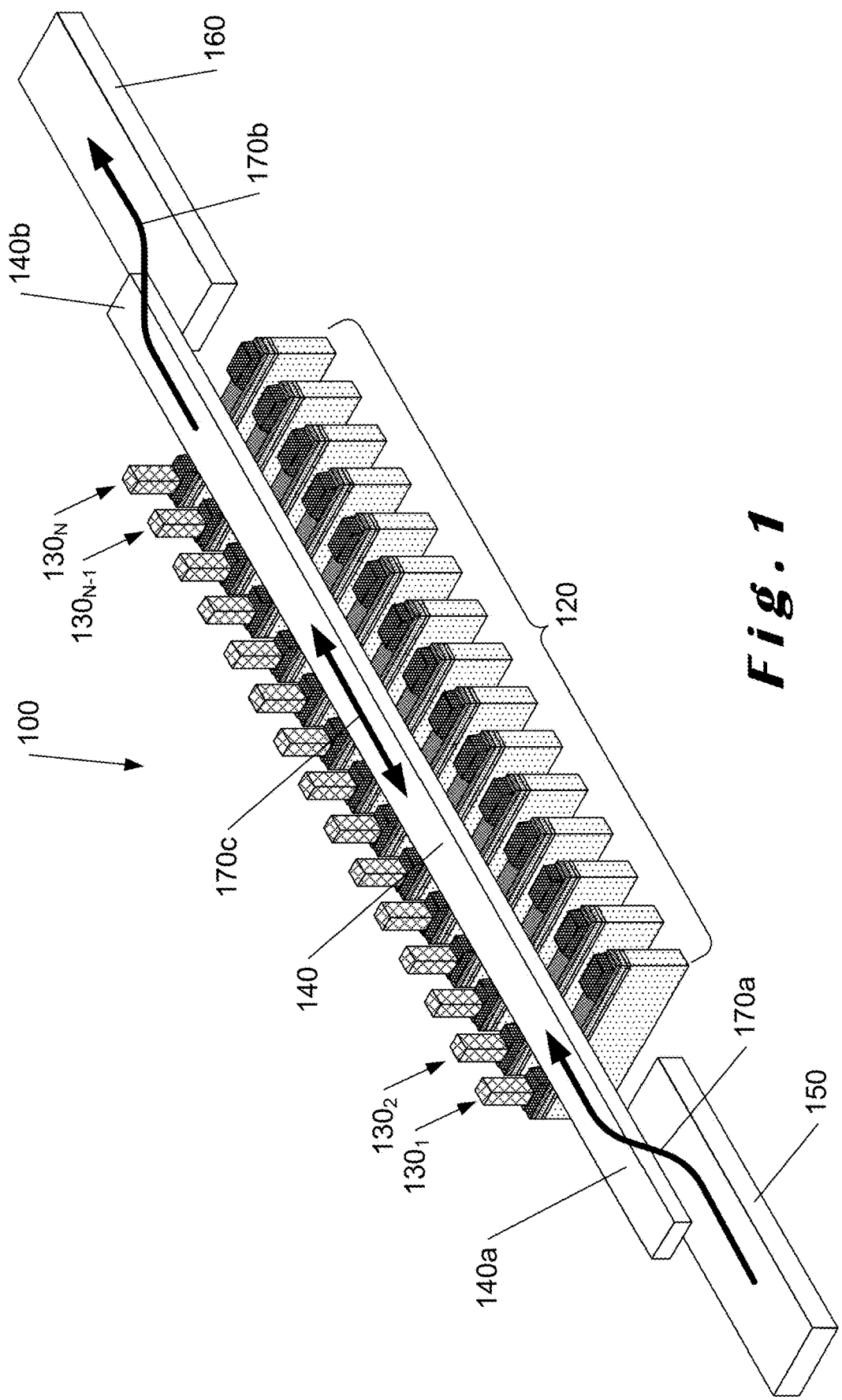
FIG. 1 is a schematic perspective view of a representative embodiment of a semiconductor waveguide laser device in accordance with the present disclosure.

All the figures are schematic, not necessarily to scale, and generally only show parts which are necessary to elucidate example embodiments, wherein other parts may be omitted or merely suggested.

DETAILED DESCRIPTION

The present disclosure will be described with respect to particular embodiments and with reference to certain drawings but the disclosure is not limited thereto. The drawings described are only schematic and are non-limiting. In the drawings, the size of some of the elements may be exaggerated and not drawn on scale for illustrative purposes.

Furthermore, the terms "first", "second", "third" and the like in the description and in the claims, are used for distinguishing between similar elements and not necessarily for describing a sequential or chronological order. The terms may be interchangeable under appropriate circumstances and the embodiments of the disclosure may operate in sequences other than those described or illustrated herein.

Moreover, the terms "top", "bottom", "over", "under" and the like in the description and the claims are used for descriptive purposes and not necessarily for describing relative positions. The terms so described may be interchangeable under appropriate circumstances and the embodiments of the disclosure described herein may operate in orientations other than those described or illustrated herein.

Furthermore, the various embodiments, although referred to as "preferred", are to be construed as exemplary manners in which the disclosure may be implemented rather than as limiting the scope of the disclosure.

In the present disclosure, a semiconductor waveguide laser device comprises an array of optically active Group III-V fin elements with a perpendicularly oriented passive optical overlay waveguide which creates a heterogeneous, periodic Group III-V/silicon waveguide in which optical gain can be achieved. In addition, optical confinement and guiding can be provided with respect to the fins and surrounding oxide material. The overlap of the optical mode with III-V active layer can be optimized by engineering layer thicknesses, recess depths and waveguide width etc. Moreover, the overlay waveguide of the present disclosure has maximum confinement in silicon leading to efficient coupling to passive silicon waveguide circuit.

The terms "fin", "fin structure" and "fin element" as used herein refer to the physical shape of elements positioned in an array for generating light and transmitting that light into the optical overlay waveguide located adjacent to such a fin. Typically, the fins form part of an array in order to increase the light generated from the device of which the fin forms a part. However, in its simplest form, there may be a single fin associated with the optical overlay waveguide. It will be appreciated that any number of fins or fin structures may be present according to the particular implementation.

The fins may form a periodic fin array which can be used either in a sub-wavelength regime or as a diffraction grating. In the sub-wavelength regime, the period or spacing of the fins can be less than the first order Bragg grating period (typically between 200 nm and 300 nm) and has no diffraction effect. An optical cavity of a laser device in this mode can be considered to be an optical amplifier. When used as a diffraction grating, the period or spacing between the fins can be greater than the first order Bragg grating period and the fin array can be optimized to operate as embedded distributed feedback (DFB) or distributed Bragg reflector (DBR) gratings by engineering layer thicknesses, recess depths, waveguide widths, etc. In effect, either a DFB- or DBR-type laser can be provided with efficient coupling to a passive waveguide circuit.

The term "highly doped" as used herein is intended to refer to a material which is either negatively doped, for example, n+ or n++, when compared to the same material which has no doping.

FIG. 1 illustrates a perspective view of a representative embodiment of a semiconductor waveguide laser device 100 in accordance with the present disclosure. The laser device 100 comprises an array 120 of fin elements 1301, 1302, . . . , 130N-1, 130N (referred to generally as 130N below) on which an optical overlay waveguide 140 can be positioned and into which light generated by each fin element can be transmitted.

In the illustrated embodiment of the laser device 100, N=15, but it will readily be appreciated that any other suitable number of fin elements can be implemented according to the particular application for which the laser device is to be used. The fins are generally referenced below as 130N. A representative fin is described in more detail with reference to FIG. 8 below.

The optical amorphous silicon (a-Si) overlay waveguide 140 can be connected to silicon passive waveguides 150, 160 at each end thereof as shown. End portions 140a, 140b of the a-Si optical waveguide 140 overlay respective ones of the silicon passive waveguides 150, 160. Laser light can be generated and amplified as it passes over the fins 130N through the overlay waveguide 140 as indicated by double arrow 170c. Laser light generated in the fins 130N and the overlay waveguide 140 can be coupled to the passive silicon waveguide 160 as illustrated by arrow 170b.

Alternatively, the structure can be used as an optical amplifier when light from a passive silicon waveguide 150 couples with overlay waveguide 140 (as shown by arrow 170a) and is subsequently amplified in the fins 130N and the overlay waveguide 140 and coupled back to the passive waveguide 160.

Although the overlay waveguide 140 is described as being made of a-Si, it will readily be appreciated that it can also be made from polycrystalline silicon or any other suitable material.

Figure 2:
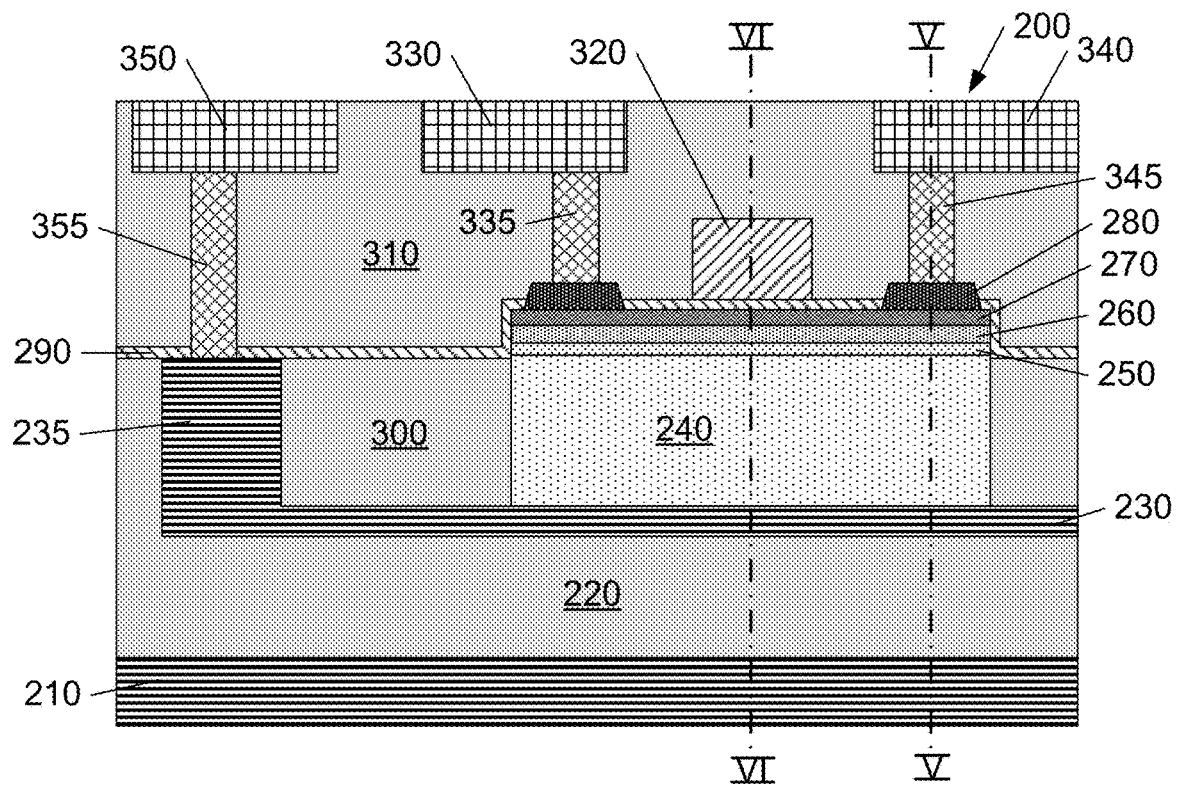
FIG. 2 illustrates a transverse cross-section through a fin of the representative laser device of FIG. 1.

Turning now to FIG. 2, a transverse cross-section through a first embodiment of a fin structure 200 before excess semiconductor material is etched away is shown illustrating the different layers deposited on a starting silicon-on-insulator (SOI) wafer before the unnecessary layers are etched away or removed to form one of the final fins 130N as shown in FIG. 1.

The starting silicon-on-insulator wafer comprises a semiconductor substrate 210, a buried oxide layer 220 and a silicon layer 230. The silicon layer 230 comprises an n+ doped silicon material which has a higher doping (n++) in an upper region 235. This may be done by STI-like fin patterning as described in more detail below.

Although the present disclosure has been described as starting from a SOI wafer, it will readily be appreciated that the buried oxide and silicon layers can be formed as separate layers over the silicon substrate.

Layer 230 has a typical thickness of between 20 nm and 100 nm with a thickness of between 100 nm and 1000 nm between the upper region 235 and the base of the layer 230.

Figure 8:
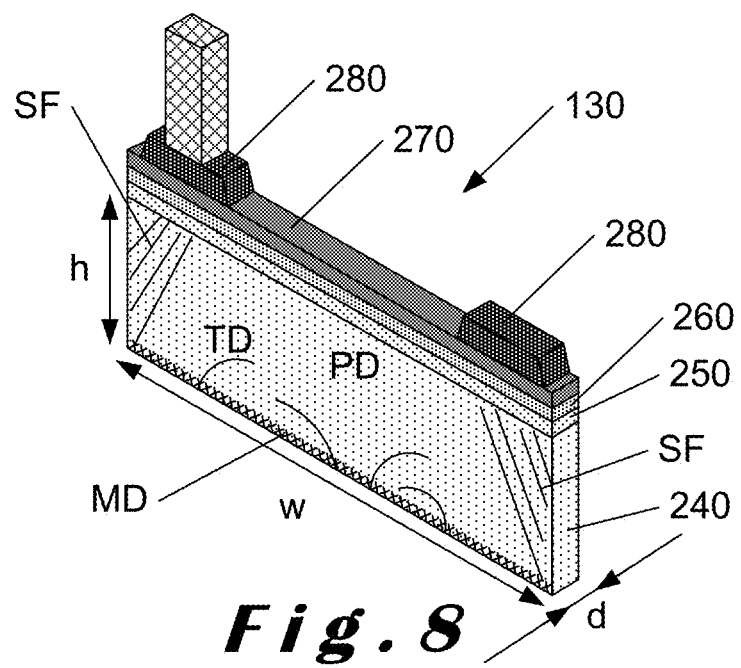
FIG. 8 is a schematic perspective view of a single fin of the representative laser device of FIG. 1 (not showing the overlay waveguide).

Over layer 230, a layer 240 can be deposited which forms the base of the fin as shown more clearly in FIG. 8. Layer 240 comprises an n-type Group III-V material such as indium-phosphide, InP, and may have: a width, w, between 1000 nm and 5000 nm; a height, h, between 100 nm and 1000 nm; and a depth, d, between 20 nm and 600 nm (the dimensions for w, h and d are shown in FIG. 8). The dimensions of the fin can be chosen such that their h/d aspect ratio is greater than 1, in order to realize aspect-ratio trapping of TD defects originating from the interface between layers 230 and 240.

Layer 250 can be formed over layer 240 and comprises an n+ doped layer of InP. This can be followed by an active layer 260 comprising indium-gallium-arsenide InGaAs, and then by a layer 270 of p+ doped InP, and, a contact layer 280 of p+ doped In(Ga)As. Layers 250, 260, 270, 280 are shown more clearly in FIG. 4. A passivation and chemical-mechanical planarization (CMP)/etch stop layer 290 can be formed over layer 270 and around contact layer 280. In regions where a fin is not present, STI layers 300, and a pre-metal dielectric (PMD) layer 310 can be provided between the layer 230 and the layer 290, and over layer 290 respectively.

An overlay waveguide 320 can be formed on the layer 290 and typically comprises materials with refractive index greater than that of InP, such as, amorphous silicon (a-Si) or poly-crystalline silicon. Typical dimensions for the waveguide 320 are: width (in a direction transverse to a w-h plane of the fins) of between 100 nm and 1000 nm; and thickness (in a direction aligned with the w-h plane of the fins) of between 50 nm and 500 nm. The length of the waveguide 320 (along the array 120) can be determined according to the number of fins 130N in the array 120.

Metal interconnectors 330, 340 can be connected to contact layer 280 by means of contact plugs 335, 345, and, metal interconnector 350 can be connected to upper region 235 by means of contact plug 355. Metal interconnects 330, 340, 350 can be typically made of copper and the contact plugs can typically be made of tungsten, for example.

Layers 240, 250, 260, 270, 280 together can form a fin 130 as shown in FIG. 1, and, as described in more detail below with reference to FIG. 8.

Figure 3:
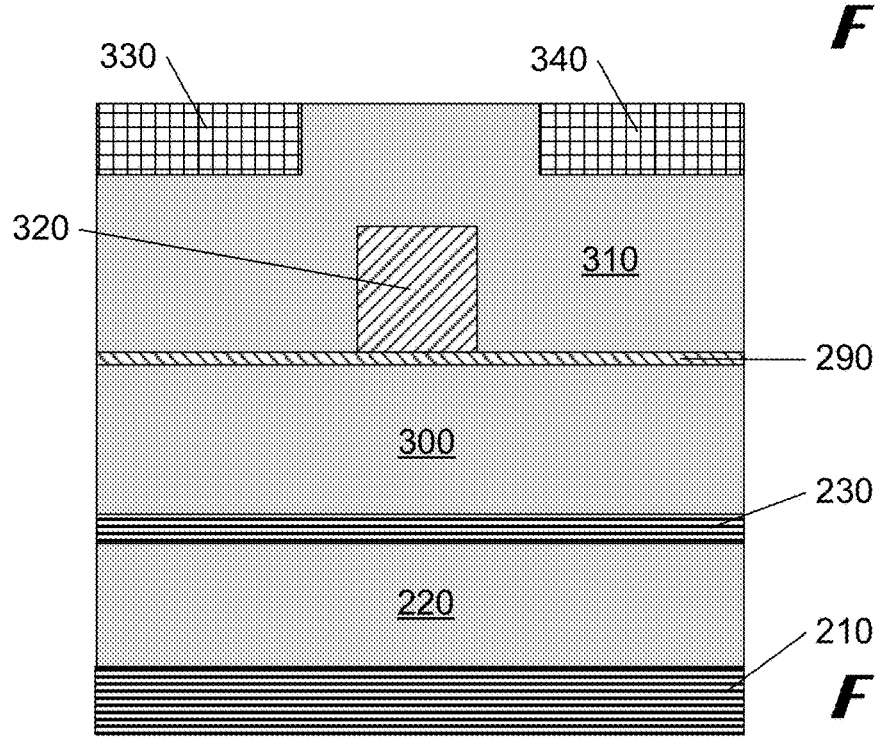
FIG. 3 illustrates a transverse cross-section between fins through a shallow trench isolation (STI) oxide of FIG. 1.

FIG. 3 is a transverse cross-section view between fins through a shallow trench isolation (STI) oxide, and, components which have been previously described with reference to FIG. 2 bear the same references. Here, only the layers in the regions between the fins are shown. Layer 230 is optional in these regions and could also be etched.

As described above, FIG. 4 shows the layers of a contact area in more detail. Each of layers 240, 250, 260 and 270 may have typical thicknesses of between 20 nm and 200 nm. It will be appreciated that, for each layer, the thickness may be optimized in accordance with a particular implementation. Layer 270 may have a typical width (in the same direction as the width of the fin 130 shown in FIG. 8) of between 20 nm and 200 nm.

Figure 4:
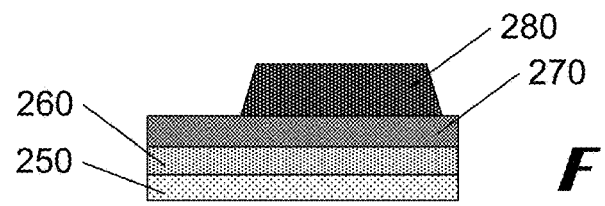
FIG. 4 illustrates an enlarged view of the top contact layer of the fin structure of FIG. 2.

In addition, although not shown in FIG. 4, the region of layer 290, over layer 270, may have a thickness between 5 nm and 50 nm.

Figure 5:
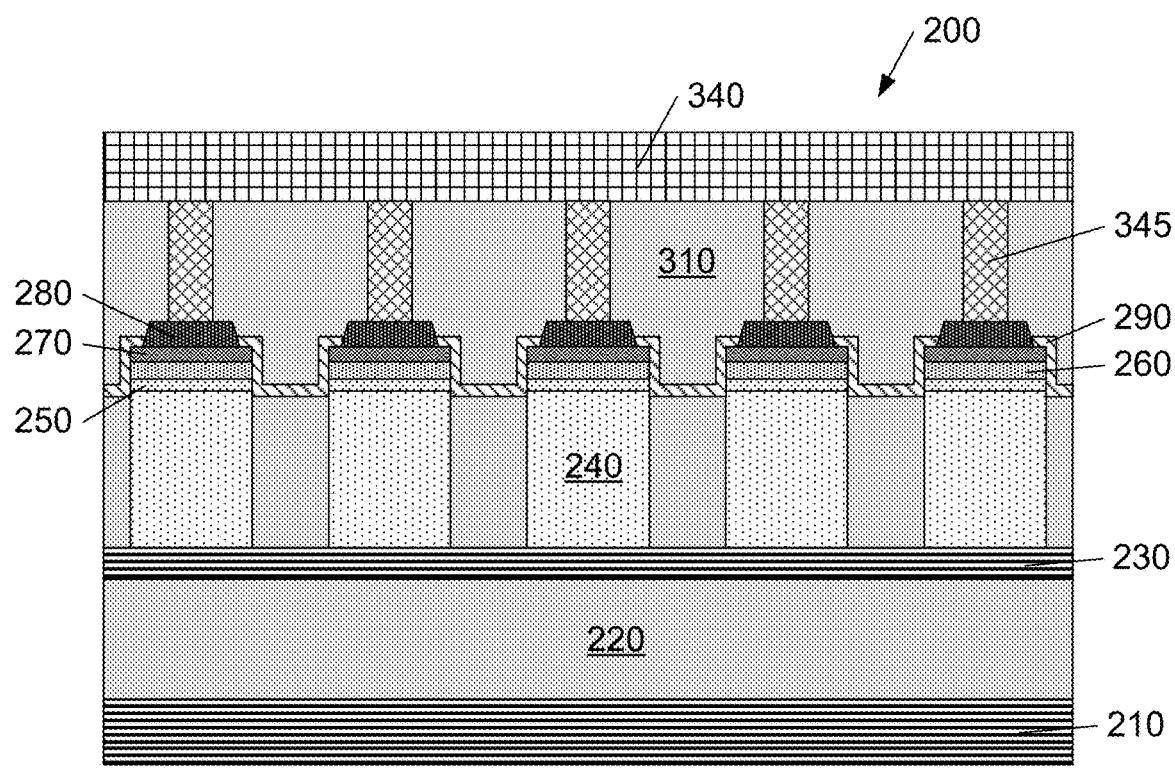
FIG. 5 illustrates a longitudinal cross-section view through p contacts of the laser device taken along line V-V of FIG. 2.

FIG. 5 shows a longitudinal sectional view through p contacts of the fin structure 200 shown in FIG. 2 taken along line V-V thereof. Components which have been described above in relation to FIG. 2 bear the same references. Metal interconnector 340 is shown as being continuous as the fins have not yet been separated. A part of an array 120 or a plurality of fins 130 is shown in this section through the fin structure 200 where the fins are identical. As a result, references are only shown on the two outermost fins for clarity.

The pitch between fins may be between 40 nm and 800 nm.

Figure 6:
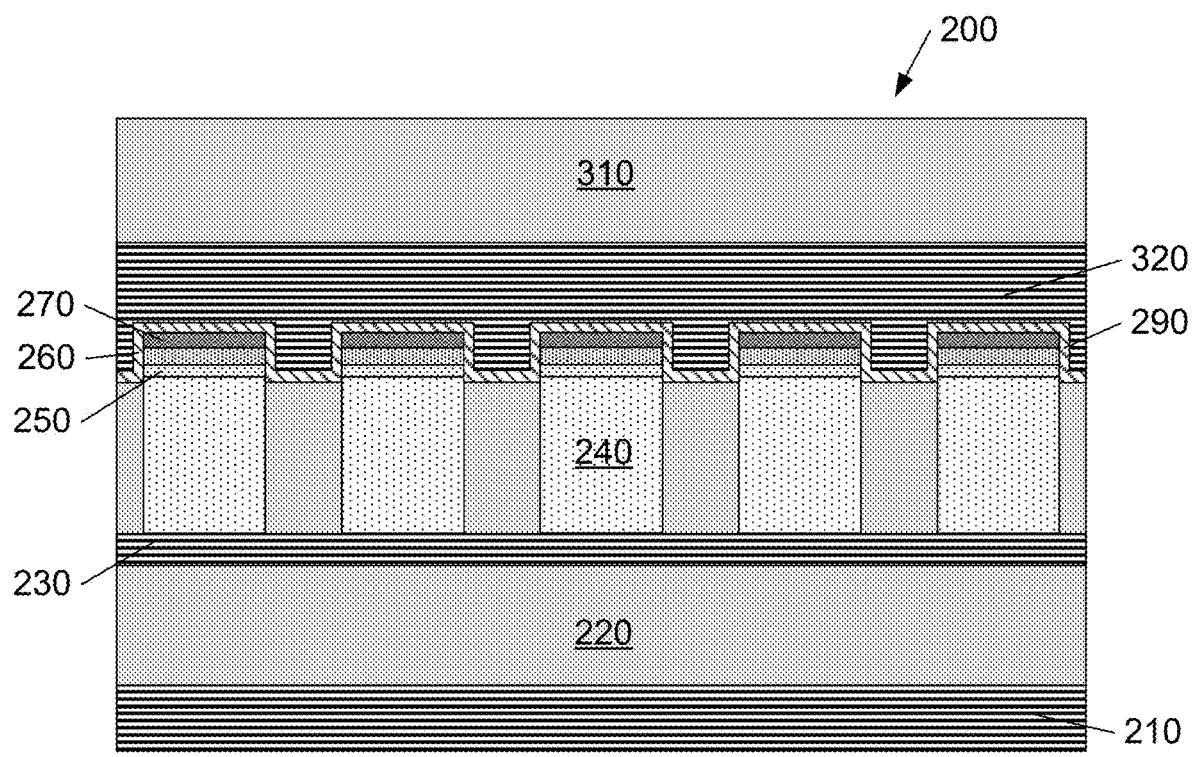
FIG. 6 illustrates a longitudinal cross-section through a waveguide taken along line VI-VI of FIG. 2.

FIG. 6 shows a longitudinal sectioned view through the waveguide 320 of the fin structure 200 taken along lines VI-VI in FIG. 2. Again, components which have previously been described bear the same references. A part of an array 120 or a plurality of fins 130 is shown in this section through the fin structure 200 where the fins are identical. As a result, references are only shown on the two outermost fins for clarity. In this Figure, contact layer 280 is not visible but the remaining layers forming the fins are shown.

As shown in FIG. 6, due to the shape of the layer 290 over the layers 250, 260, 270, troughs or depressions are formed (typically of between 0 nm and 200 nm) with the thickness of the waveguide 320 from the base of such troughs or depressions being between 0 nm and 500 nm.

Figure 7:
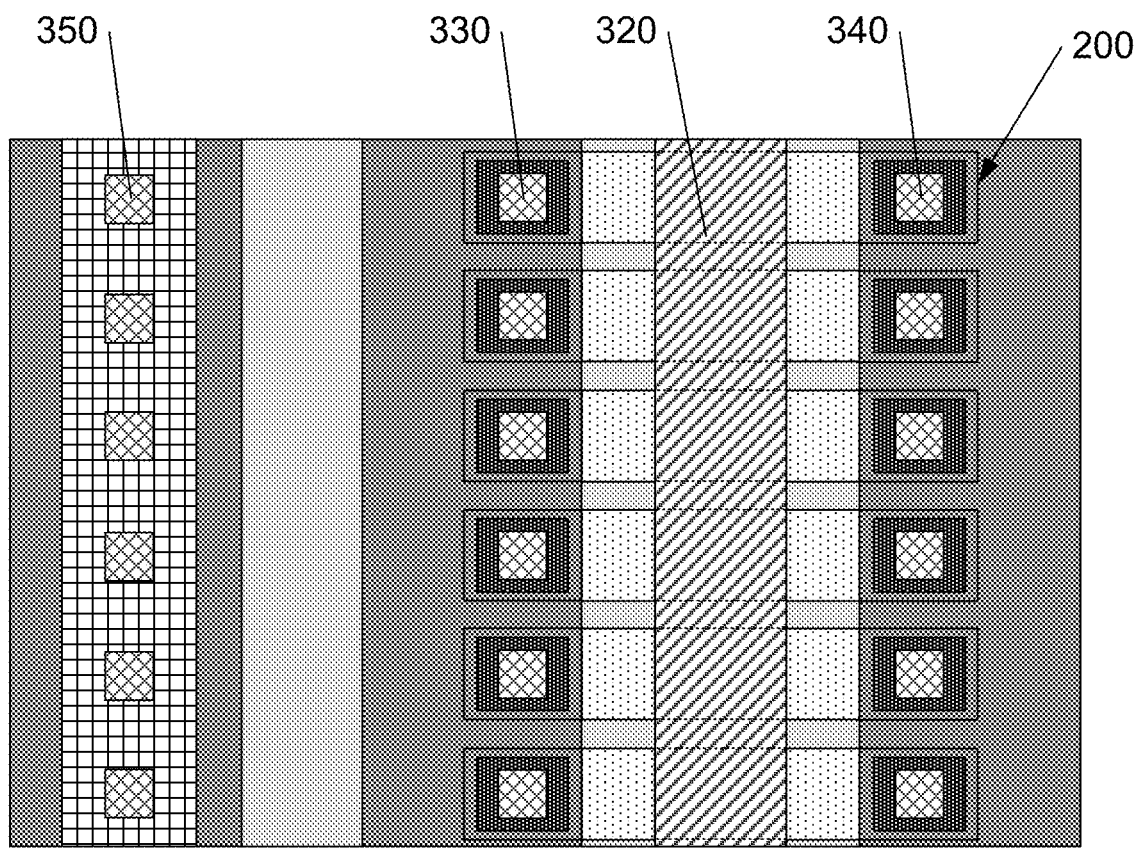
FIG. 7 illustrates a top view of the representative laser device of FIG. 1.

FIG. 7 is a top view of the fin structure 200 described above with reference to FIGS. 2 to 6 with metal interconnectors 330, 340, 350 being shown. As shown, a plurality of fin elements 200 are shown (although only one is labelled for clarity). The fin elements 200 extend underneath the waveguide 320 as described above.

FIG. 8 is a perspective view of a single fin 130 in which the layers of which it is comprised are clearly shown. As before, components which have been described with reference to FIGS. 2 to 7 bear the same references.

A fin is prone to defects due to direct epitaxial growth of InP/InGaAs on silicon. As shown in FIG. 8, these defects can include misfit dislocations (MDs), linear threading dislocations (TDs), planar stacking faults (SFs), and, point defects (PDs). The MD defects are shown as crosses; the SF defects are shown as straight lines and the PDs are shown as dots. While MDs tend to be present at the interface with the substrate on which the fin is grown, TDs can extend as linear defects approximately perpendicular from the silicon-InP interface, and SFs can extend as planar defects approximately perpendicular to the fin direction, while PDs may be present throughout the body of the fin.

In the present disclosure, aspect-ratio trapping of the TD defects can be realized in the interface between layers 240 and 300 owing to orientation of the TDs and the aspect ratio of the grown fin (the dimensions of the fin are described above). MD defects can be confined in a lower part of the fin as shown. Whilst SF defects can be present throughout the structure after epitaxial growth, but these defects can be relocated by post-growth anneal to the outer edge of the InP fin, away from the optical active region of the device.

Figure 9:
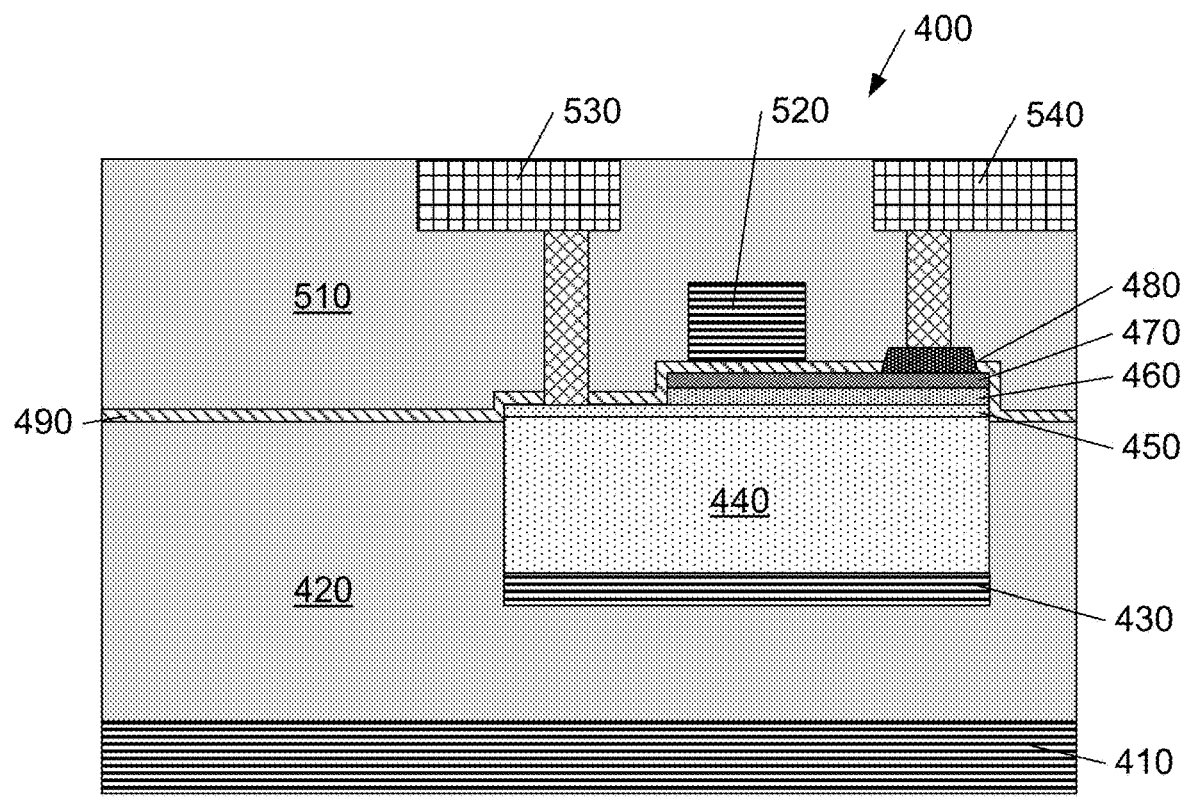
FIG. 9 illustrates a transverse cross-section through a second representative embodiment of a semiconductor waveguide laser device in accordance with the present disclosure.
Figure 10:
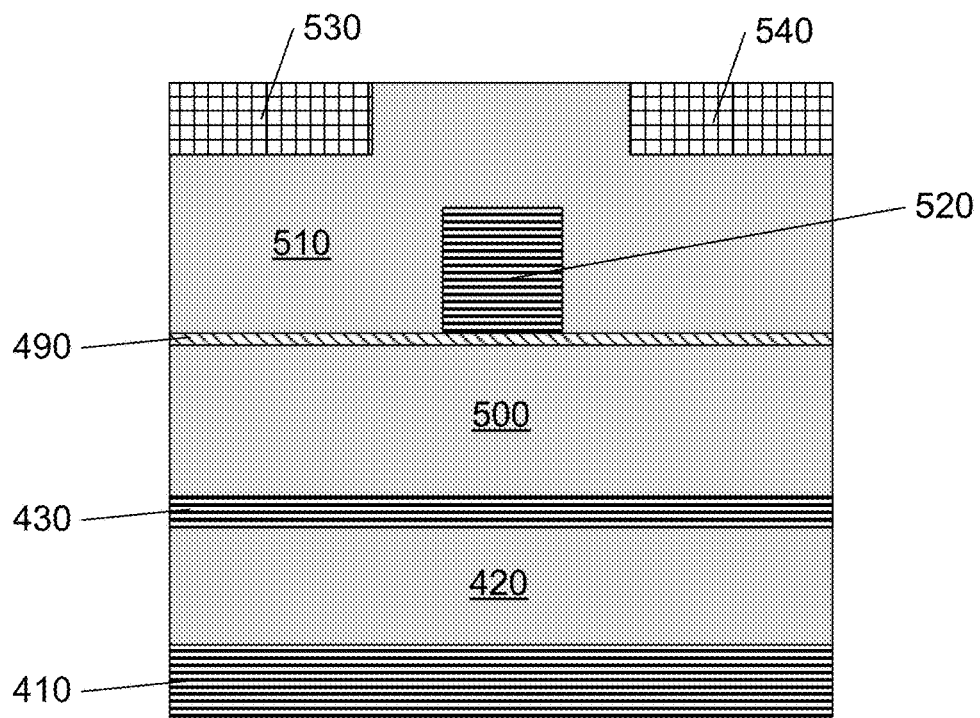
FIG. 10 illustrates a transverse cross-section through the representative laser device of FIG. 9 but adjacent to a fin.

FIGS. 9 and 10 illustrate a second representative embodiment of a fin structure 400. The fin structure 400 is similar to the fin structure 200 described above, and, components which have been described above with reference to FIGS. 2 and 3 are similarly referenced, that is, having the same last two digits but preceded by a '4' or '5' instead of a respective one of a '2' or '3'.

In FIGS. 9 and 10, the fin structure 400 comprises an SOI wafer including a substrate 410, a buried oxide layer 420, and a silicon layer 430 (as described above with reference to FIG. 2), which has been etched to allow a fin body 440 to be formed by InP on the silicon layer 430. An n+ doped layer 450 of InP can be formed over the fin body 440. This can be followed by an active layer 460 comprising InGaAs, and then by a layer 470 of p+ doped InP, and, a contact layer 480 of p+ doped In(Ga)As. A passivation and chemical-mechanical planarization (CMP)/etch stop layer 490 can be formed over layer 470 and around contact layer 480. In regions where a fin is not present, STI layer 500, and PMD layer 510 can be provided between the layer 430 and the layer 490, and over layer 490 respectively. An overlay waveguide 520 of a-Si can be formed on the layer 490 as shown.

In the representative embodiment shown in FIGS. 9 and 10, the fin structure 400 includes an n-type InP contact which can be directly contacted by the metal contact plug instead of being in contact through an n+ silicon layer.

Figure 11:
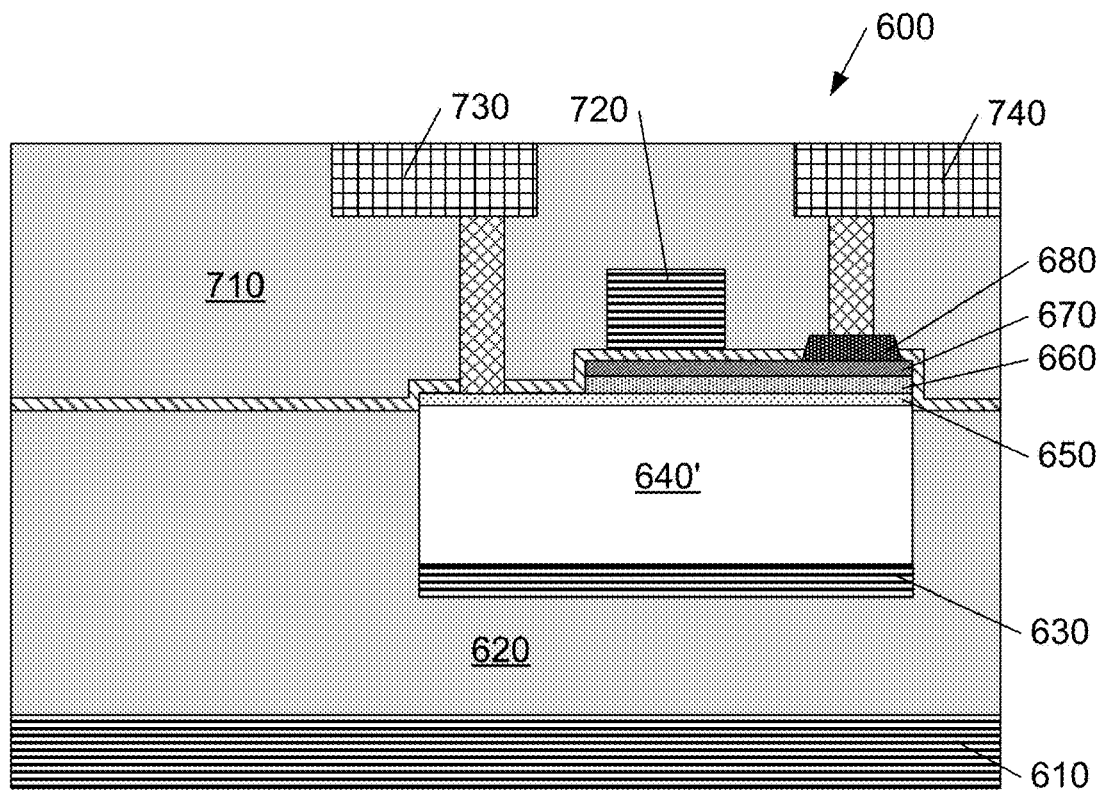
FIG. 11 illustrates a transverse cross-section through a third representative embodiment of a semiconductor waveguide laser device in accordance with the present disclosure.
Figure 12:
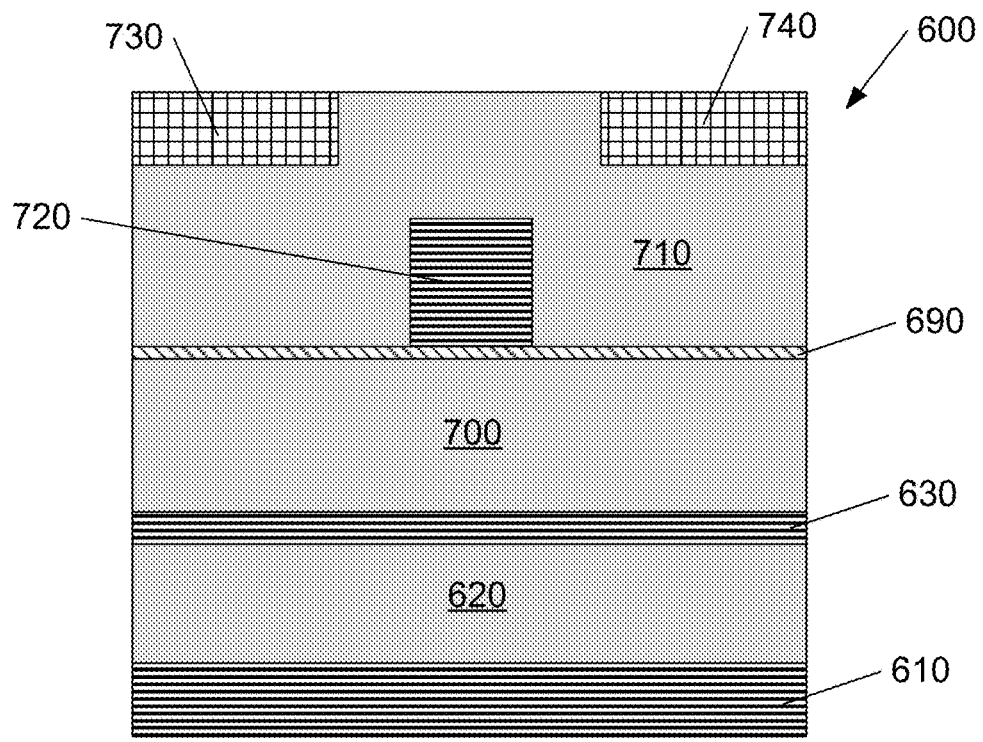
FIG. 12 illustrates a transverse cross-section through the representative laser device of FIG. 11 but adjacent to a fin.

FIGS. 11 and 12 illustrate a third representative embodiment of a fin structure 600 where the InP buffer layer of the fin body portion 640' can be etched out. The fin structure 600 comprises an SOI wafer including a substrate 610, a buried oxide layer 620, and a silicon layer 630 (as described above) with the fin body 640' being formed etched out. An n+ doped layer of InP can be formed over the fin body 640. This can be followed by an active layer 660 comprising InGaAs, and then by a layer 670 of p+ doped InP, and, a contact layer 680 of p+ doped In(Ga)As. A passivation and chemical-mechanical planarization (CMP)/etch stop layer 690 can be formed over layer 670 and around contact layer 680. In regions where a fin is not present, an STI layer 700 and a PMD layer 710 can be provided between the layer 630 and the layer 690, and over layer 690 respectively. An overlay waveguide 720 of a-Si can formed on the layer 690 as shown.

Figure 13:
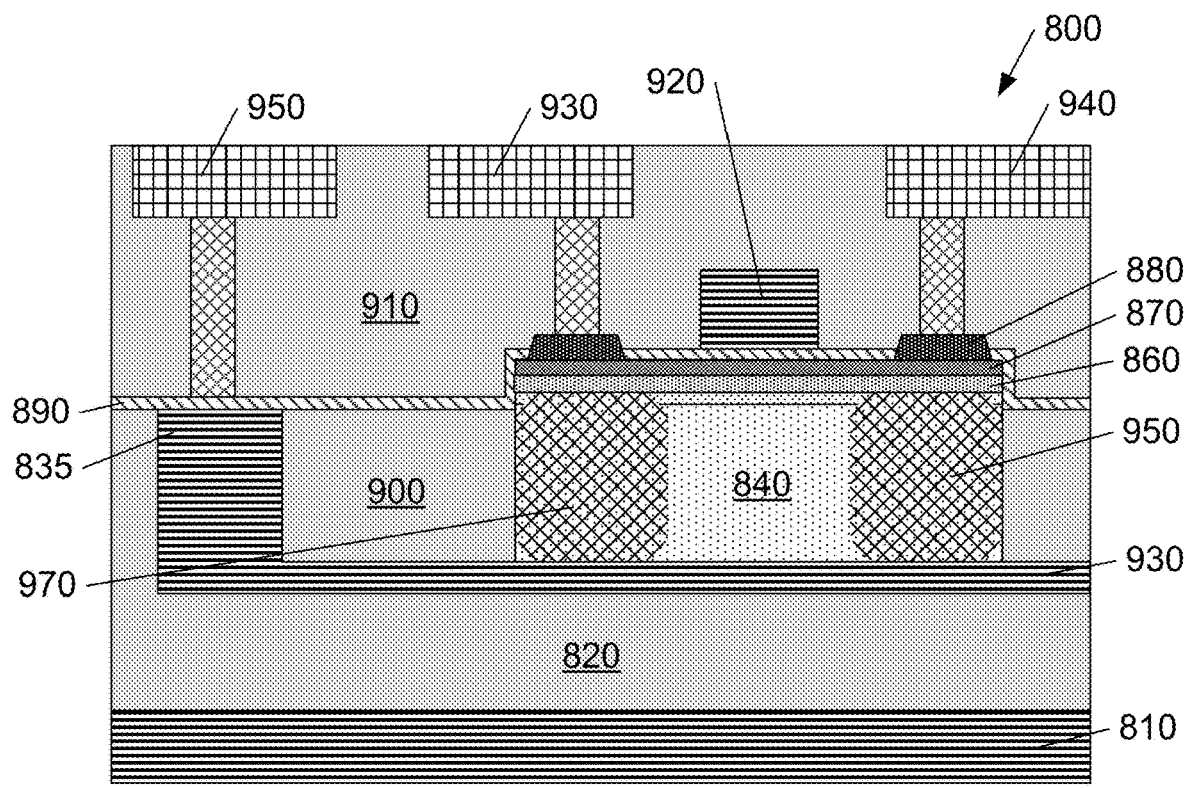
FIG. 13 illustrates a transverse cross-section through a fourth representative embodiment of a semiconductor waveguide laser device in accordance with the present disclosure.
Figure 14:
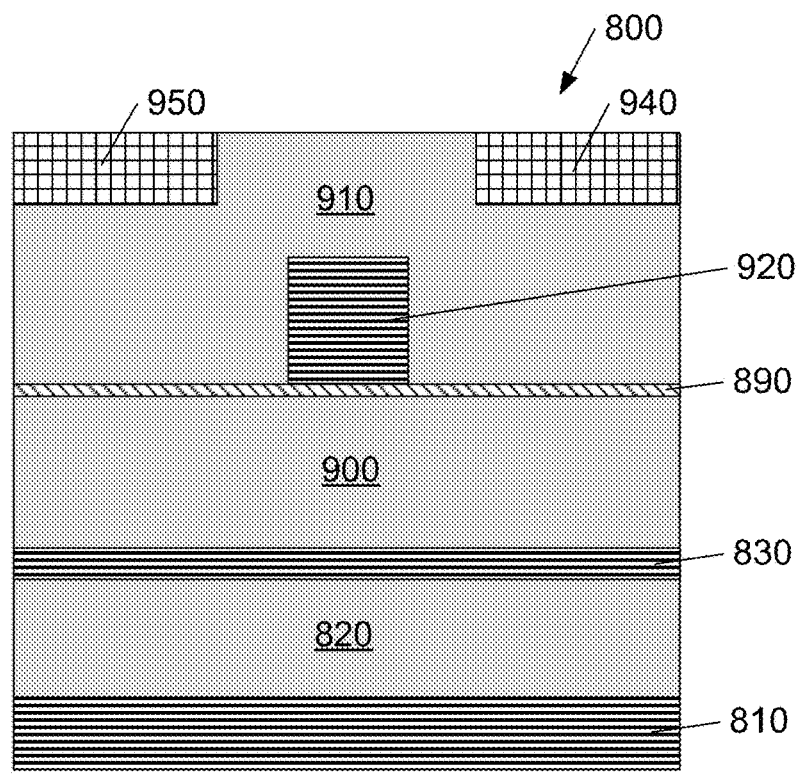
FIG. 14 illustrates a transverse cross-section through the representative laser device of FIG. 13 but adjacent to a fin.

FIGS. 13 and 14 illustrate a fourth representative embodiment of a fin structure 800 which is similar to the fin structure 200 shown in FIGS. 2 to 7 but where the fin body portion 840 includes semi-isolating InP regions 960, 970 created by ion implantation. Components which have previously be described with reference to FIGS. 2 to 7 bear similar reference numerals where the last two digits are the same with a preceding numeral of either an '8' or a '9' instead of a '2' or a '3'.

The fin structure 800 comprises an SOI wafer including a semiconductor substrate 810, a buried oxide layer 820, and a silicon layer 830 (as described above) is formed. The silicon layer 830 comprises an n+ doped silicon material which has a higher doping (n++) in an upper region 835.

Similarly to FIG. 2, layer 830 has a typical thickness of between 20 nm and 100 nm with a thickness of between 100 nm and 1000 nm between the upper region 835 and the base of the layer 830. Over layer 830, a layer 840 can be deposited which forms the base of the fin. Layer 840 comprises an n-type Group III-V material such as indium-phosphide, InP.

Layer 850 can be formed over layer 840 and comprises an n+ doped layer of InP. This can be followed by an active layer 860 comprising indium-gallium-arsenide InGaAs, and then by a layer 870 of p+ doped InP, and, a contact layer 880 of p+ doped In(Ga)As. A passivation and chemical-mechanical planarization (CMP)/etch stop layer 890 can be formed over layer 870 and around contact layer 880. In regions where a fin is not present, STI layer 900 and PMD layer 910 can be provided between the layer 830 and the layer 890, and over layer 890 respectively. As described above, an overlay waveguide 920 can be formed on the layer 890 and comprises amorphous silicon (a-Si).

Metal interconnectors 930, 940 can be connected to contact layer 880 by means of contact plugs 935, 945, and, metal interconnector 950 can be connected to upper region 835 by means of contact plug 855.

Semi-isolating InP regions 960, 970 are intended to improve current injection efficiency by steering current to the active region for the optical mode. In effect, the implants in semi-isolating InP regions 960, 970 steer current to the active region with optical mode to improve the current injection efficiency.

Figure 15:
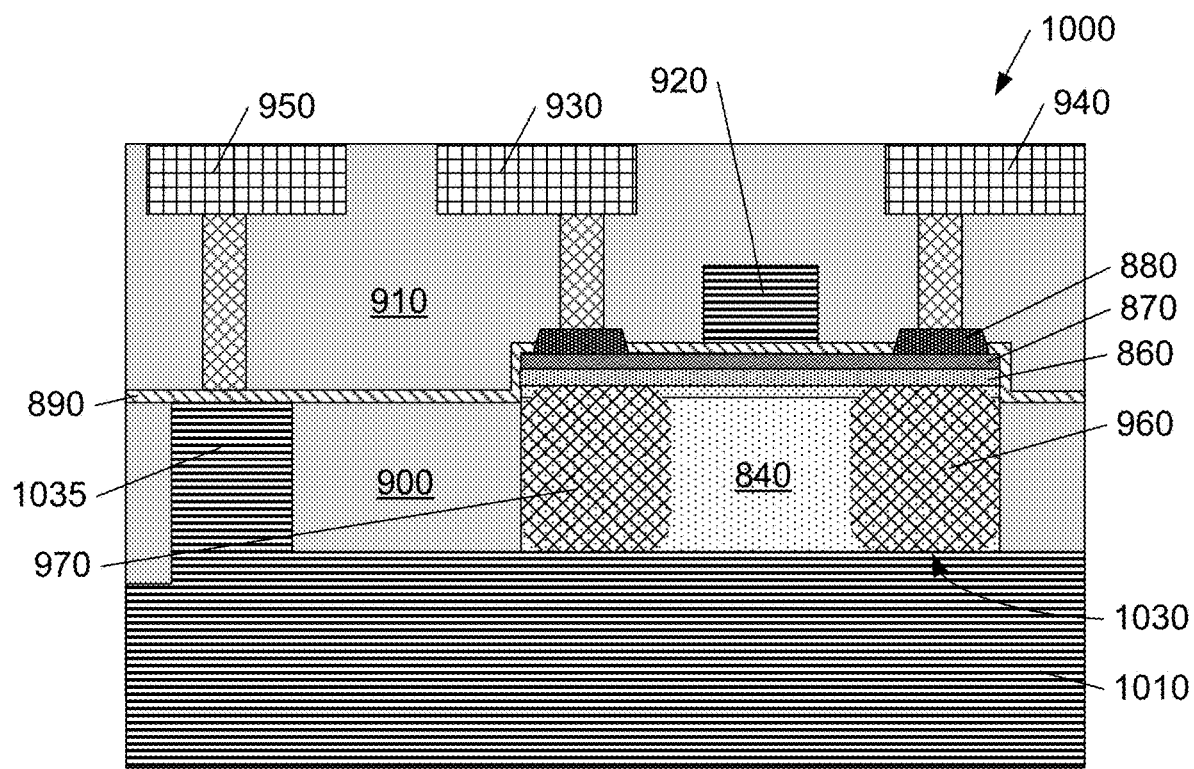
FIG. 15 illustrates a transverse cross-section through a fifth representative embodiment of a semiconductor waveguide laser device in accordance with the present disclosure.
Figure 16:
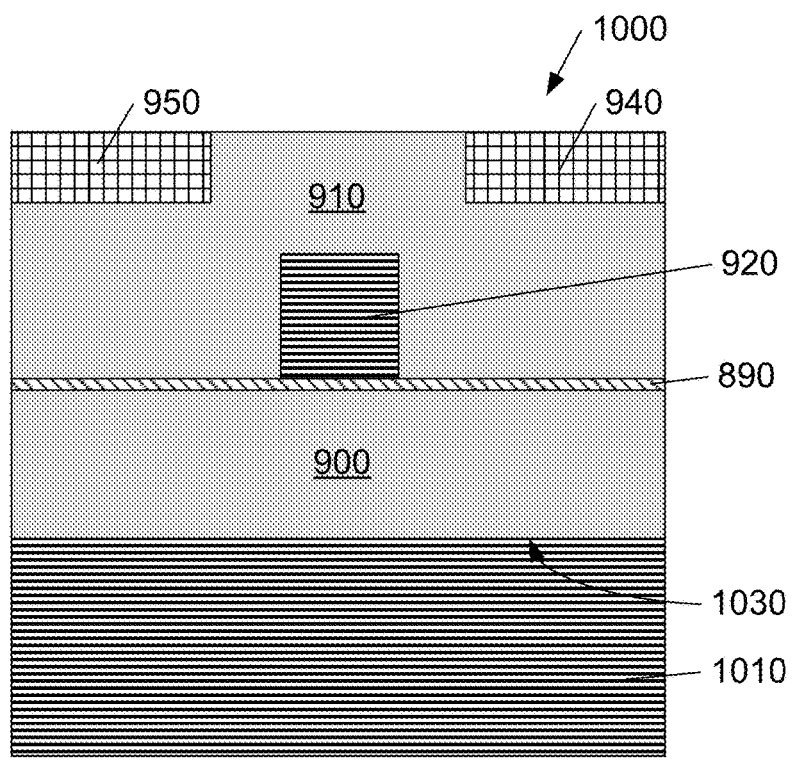
FIG. 16 illustrates a transverse cross-section through the representative laser device of FIG. 15 but adjacent to a fin.

FIGS. 15 and 16 illustrate a fifth representative embodiment of a fin structure 1000 which is similar to FIGS. 13 and 14 but which include a bulk silicon wafer for deep-trench isolation. Components which are the same are referenced alike. The main differences between the embodiment of FIGS. 13 and 14 and the embodiment of FIGS. 15 and 16 is that the substrate 810, the buried oxide layer 820 and the layer 830 comprises a single bulk silicon wafer including a layer 1010 which can be doped to provide an n+ doped silicon region 1030 adjacent the fin structure and an n++ doped silicon region 1035 adjacent the passivation and chemical-mechanical planarization (CMP)/etch stop layer 890.

The n+ doped silicon region 1030 is optional, and in another embodiment, this layer may be etched.

The construction of a representative fin in accordance with the present disclosure will now be described with reference to FIGS. 17 to 28. In the following description, components or elements that are identical are referenced the same, and, components or elements that are similar are referenced the same but include one or more of a subscript, a prime (') or double prime (").

In the following Figures, the formation of the fin etc. is described starting from an SOI wafer comprising a silicon substrate 1110, a buried oxide layer 1120 and a silicon layer 1130 as described above with reference to FIG. 2 above. In a first step, a silicon-on-insulator (SOI) STI process can be used to produce oxide planarized silicon fins in the top silicon layer of the SOI wafer.

FIGS. 17a to 17c illustrate STI-like fin patterning of the starting SOI wafer. These Figures respectively illustrate a transverse cross-section through a fin, a transverse cross-section through shallow trench isolation oxide, and a longitudinal cross-section through the center of a semiconductor waveguide laser device in accordance with the present disclosure.

As shown, an STI oxide layer 1200 can be formed between a portion of the silicon layer 1130 and a silicon fin area 1140. In FIG. 17c, two fin areas 11401, 11402 are shown but it will readily be appreciated that any suitable number of fins may be formed at the same time.

FIGS. 18a to 18c respectively illustrate a transverse cross-section through a fin, a transverse cross-section through shallow trench isolation oxide, and a longitudinal cross-section through the centre of a semiconductor waveguide laser device in accordance with the present disclosure, and, illustrating silicon implantation or doping. A highly doped n-type region 1135 can be formed by ion implantation and activation to produce an n++ doped silicon contact region. In FIG. 18c, two fins 11401, 11402 are shown as before.

A selective silicon wet recess process can then performed as shown in FIGS. 19a to 19c. Here, n++ doped region 1135 can be masked so that no etching occurs therein. A portion of region 1140' corresponding to the body of the fin (not shown) can be etched away using a selective wet etch using either tetramethylammonium hydroxide (TMAH or TMAOH) or potassium hydroxide (KOH). However, it will readily be appreciated that other suitable chemicals may be used for the selective wet etch. Contact regions can be covered during the etching process, for example, with oxide from a previous deposition or patterning step, and are not etched. In FIG. 19c, two etched fins $1140'_1$, $1140'_2$ are shown.

FIGS. 20a to 20c illustrate a representative selective silicon wet etch process in which a portion 1145 of the silicon layer 1130 can be doped using ion implantation and activation to produce an n+ doped silicon contact region for the fin. In FIG. 20c, two fins $1140'_1$, $1140'_2$ are shown as before.

It will readily be understood that the processes performed as described with reference to FIGS. 18 and 20 may be performed simultaneously after the etching step described with reference to FIG. 19.

In this way (either in separate steps as described with reference to FIGS. 18 and 20 or in a single step), the silicon layer 1130 can be doped to provide two differently doped contact regions, namely, an n++ doped region 1135 and an n+ doped region 1145.

Having formed the contact regions 1135 and 1145, FIGS. 21a to and 21c illustrate selective indium-phosphide (InP) buffer growth. Here, the body of the fin 1140" can be grown using selective area epitaxial growth of InP. The InP material fills the etched void created in the etching step described with reference to FIG. 19 above. In FIG. 21c, two fins 1140"$_1$, 1140"$_2$ are shown.

Figure 22A:
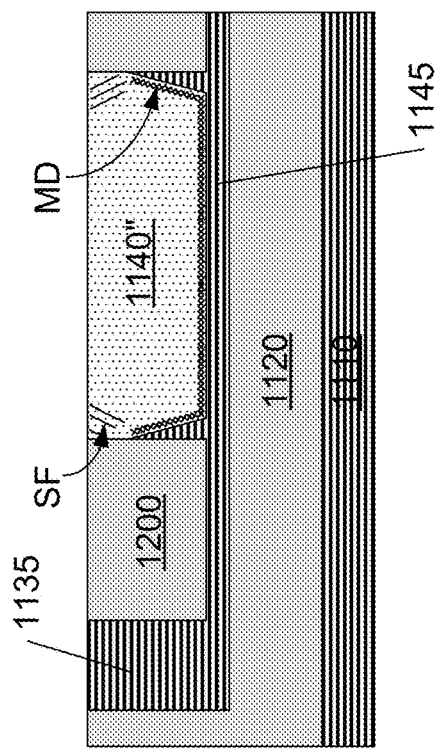
FIGS. 22a, 22b and 22c are similar to respective ones of FIGS. 21a, 21b and 21c, and, illustrate the outcome of a representative annealing and subsequent chemical-mechanical planarization process.
Figure 22B:
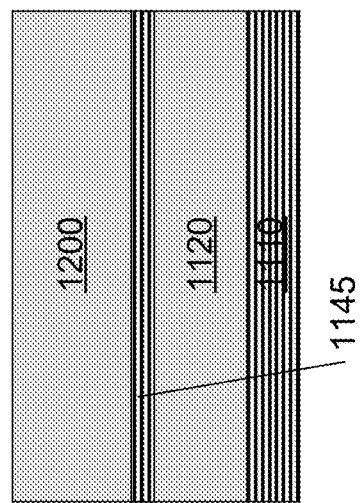
Figure 22C:
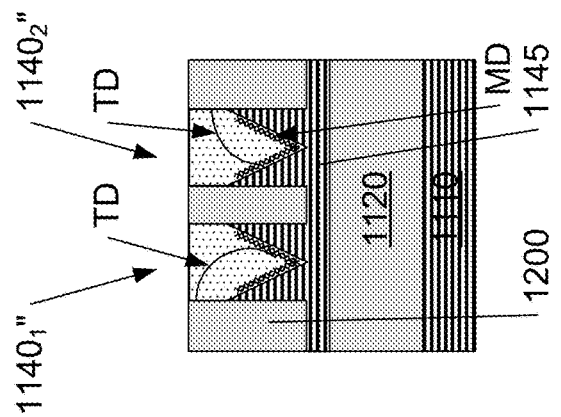

During such a growth step, MD, TD and SF defects can be formed as shown. The MD defects can be formed at the junction between the body of the fin and the contact region 1145. SF defects can extend as planar defects throughout the body of the fin 1140" as shown. In order to minimize the impact such defects, the next step can be an annealing step to reduce PD defects and to guide SF defects to the edges of the fin as shown in FIGS. 22a to 22c. TD defects can be trapped during growth to the lower part of the fin such that they do not reach the active layer of the device, owing to their orientation and aspect ratio of the fin as described above. A CMP step of InP can be subsequently carried out to flatten the structure.

Turning now to FIGS. 23a to 23c, the layers forming the contacts can be formed. An n+ doped layer 1150 can be formed over the top of the fin body 1140" followed by an active layer of InGaAs 1160, a p+ doped layer of InP 1170 and a p+ doped contact layer of In(Ga)As 1180. Layers 1150, 1160, 1170, 1180 correspond to respective ones of layers 250, 260, 270, 280 in FIGS. 2 to 7, layers 450, 460, 470, 480 in FIGS. 9 and 10, layers 650, 660, 670, 680 in FIGS. 11 and 12, and layers 850, 860, 870, 880 in FIGS. 13 to 16 as described above. The layers 1150, 1160, 1170, 1180 can form an InGaAs/InP p-i-n stack for an active layer. The active layer may comprise an InGaAs bulk, multiple InGaAs quantum wells (MQW) or InAs quantum dots (QD). In FIG. 23c, two fins 1140"$_1$, 1140"$_2$ are shown as before.

In FIGS. 24a to 24c, a representative contact layer selective etch is shown with patterning and selective etch of the contact layer 1180. Here, a portion 1230 of the contact layer 1180 can be etched (dry or wet) to the p+ doped InP layer 1170 to form the contact areas 1240 as described above. In FIG. 24c, two fins 1140"$_1$, 1140"$_2$ are shown as before.

FIGS. 25a to 25c illustrate the addition of a passivation layer 1190 over the etched contact layer 1180. Such a passivation layer may comprise aluminum oxide ($Al_2O_3$) which suppresses surface recombination in the active layer 1160.

Figure 28C:
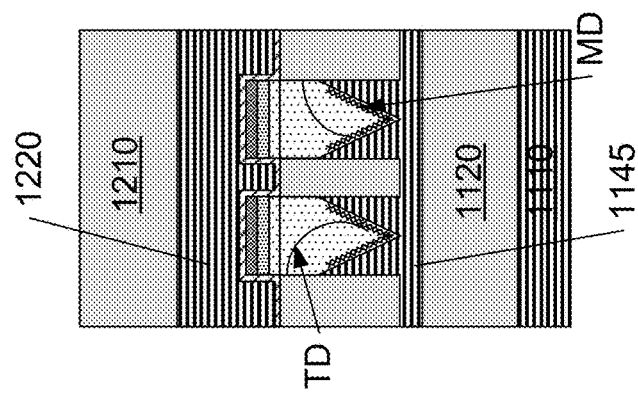
FIGS. 28a, 28b and 28c are similar to respective ones of FIGS. 27a, 27b and 27c, but illustrate the formation of contacts and metal interconnects.
Figure 28B:
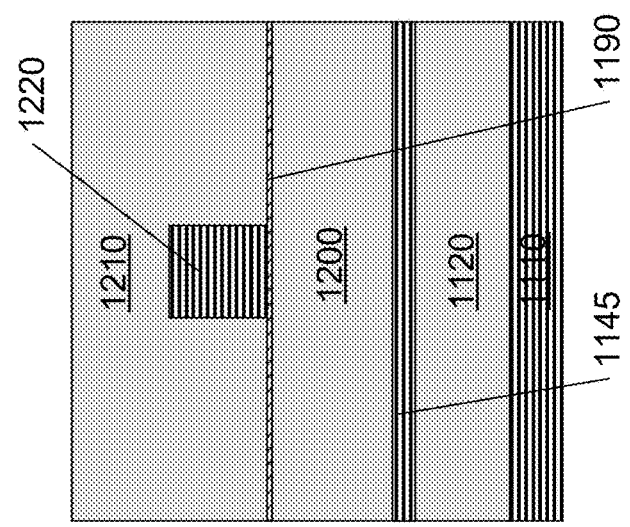
Figure 28A:
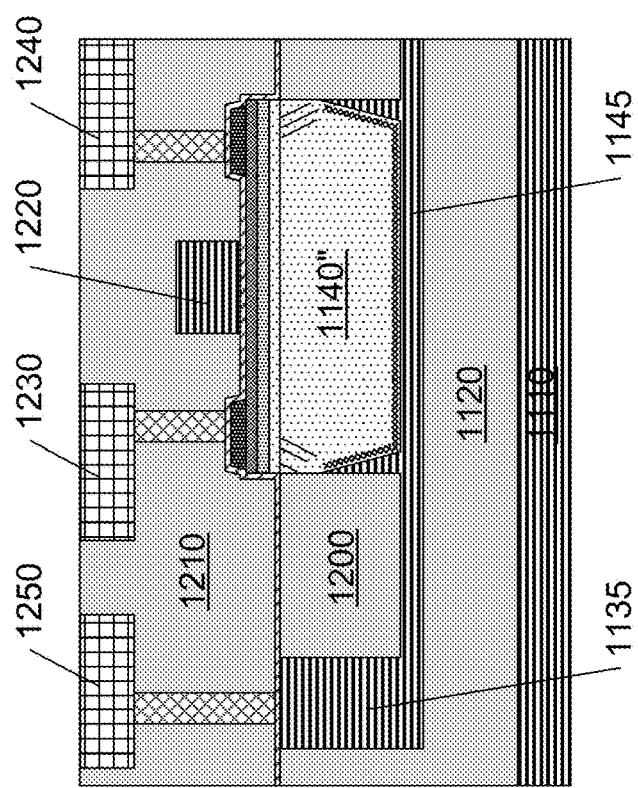

FIGS. 26a to 26c illustrate the formation of an overlay waveguide 1220 on the surface of the passivation layer 1190. Waveguide 1220 corresponds to waveguides 320 (FIGS. 2 to 7), 520 (FIGS. 9 and 10), 720 (FIGS. 11 and 12) and 920 (FIGS. 13 and 14) described above. The waveguide 1220 comprises an amorphous silicon overlay waveguide. The passivation layer 1190 may act as a (dry) etch stopping layer. As described above, the Over the overlay waveguide 1220 can be formed a pre-metal dielectric (PMD) oxide cladding layer 1210, as shown in FIGS. 27a to 27c, prior to the addition of the metal interconnectors 1230, 1240, 1250 and contact plugs 1235, 1245, 1255 associated therewith, as shown in FIGS. 28a to 28c.

The fins can be electrically stimulated and carrier injection can be provided in an active layer through a vertical p-i-n junction formed by layers 250, 260, 270, 280 in FIGS. 2 to 7, layers 450, 460, 470, 480 in FIGS. 9 and 10, layers 650, 660, 670, 680 in FIGS. 11 and 12, layers 850, 860, 870, 880 in FIGS. 13 to 16, and layers 1150, 1160, 1170, 1180 in FIGS. 23a to 23c as described above. Contact to n-type InP can be made through the n++ silicon region 1135 as shown in FIG. 28a. Contact to p-type InP can be made through low-bandgap p+ contact layer 280 (as shown more clearly in FIG. 4) which can be implemented laterally away from the core of the passive waveguide to avoid parasitic losses.

Although specific representative fin structures are described herein, it will readily be appreciated that other representative fin structures are also possible.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A laser device comprising:
at least one fin element configured to generate light when electrically stimulated, the at least one fin element comprising a body portion formed on a silicon substrate and a contact portion comprising a contact layer of indium-gallium-arsenide (In(Ga)As), p+ type material arranged over the body portion, wherein the body portion comprises an annealed epitaxially grown Group III-V material and wherein the contact portion comprises an active layer formed over the body portion, the active layer being located between the contact layer and the body portion and spaced therefrom by respective layers of p+ doped and n+ doped indium-phosphide, InP, and an etch stop layer formed over the p+ doped layer and around the contact layer;
an overlay waveguide configured to be optically coupled to the at least one fin element; and
passive waveguides optically coupled to each end of the overlay waveguide,
wherein light generated in the at least one fin and the overlay waveguide is coupled into at least one of the passive waveguides,
wherein a region is defined between the etch stop layer and the silicon substrate, wherein the at least one fin element is disposed in at least a portion of the region, wherein a shallow trench isolation (STI) layer is disposed in at least a second portion of the region, wherein the fin element has a dimensional height/depth aspect ratio greater than 1, and wherein a pre-metal dielectric (PMD) layer is located over the etch stop layer in a section of the etch stop layer that is located over the shallow trench isolation (STI) layer.

2. The laser device according to claim 1, wherein the epitaxially grown material comprises indium-phosphide (InP), gallium-arsenide (GaAs), or indium-gallium-arsenide (InGaAs).

3. The laser device according to claim 1, wherein planar stacking fault defects are located towards edges of the fin, and wherein the body portion comprises semi-isolating regions arranged on either side of a central region.

4. The laser device according to claim 1, further comprising metal interconnectors are connected to the contact layer by means of contact plugs.

5. The laser device according to claim 1, wherein the overlay waveguide comprises one of: amorphous silicon and poly-crystalline silicon.

6. The laser device according to claim 1, wherein the body portion comprises a width between 1000 nm and 5000 nm.

7. A laser device comprising:
a plurality of fin elements configured to generate light when electrically stimulated, each fin element comprising a body portion and a contact portion comprising a contact layer of indium-gallium-arsenide (In(Ga)As), p+ type material arranged over the body portion, wherein the body portion comprises an annealed epitaxially grown Group III-V material formed on a silicon substrate, wherein the plurality of fin elements are separated from each other by a distance of less than a first order Bragg grating period, and wherein the contact portion comprises an active layer formed over the body portion, the active layer being located between the contact layer and the body portion and spaced therefrom by respective layers of p+ doped and n+ doped indium-phosphide, InP, and an etch stop layer formed over the p+ doped layer and around the contact layer;

an overlay waveguide configured to be optically coupled to the plurality of fin elements, wherein a region is defined between the etch stop layer and the silicon substrate, wherein the at least one fin element is disposed in at least a portion of the region, wherein a shallow trench isolation (STI) layer is disposed in at least a second portion of the region, wherein the fin element has a dimensional height/depth aspect ratio greater than 1, and wherein a pre-metal dielectric (PMD) layer is located over the etch stop layer in a section of the etch stop layer that is located over the shallow trench isolation (STI) layer.

8. The laser device of claim 7, wherein the overlay waveguide includes depressions in regions over the plurality of fin elements, and wherein the length of the overlay waveguide is proportional to an amount of fin elements in the plurality of fin elements.

* * * * *